(12) United States Patent
Kurafuchi et al.

(10) Patent No.: US 6,774,501 B2
(45) Date of Patent: Aug. 10, 2004

(54) RESIN-SEALED SEMICONDUCTOR DEVICE, AND DIE BONDING MATERIAL AND SEALING MATERIAL FOR USE THEREIN

(75) Inventors: Kazuhiko Kurafuchi, Tsukuba (JP); Naoya Suzuki, Tsukuba (JP); Masaaki Yasuda, Tsukuba (JP); Tatsuo Kawata, Yuki (JP); Hiroyuki Sakai, Yuki (JP); Masao Kawasumi, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 10/381,034
(22) PCT Filed: Sep. 28, 2001
(86) PCT No.: PCT/JP01/08559
  § 371 (c)(1),
  (2), (4) Date: Mar. 21, 2003
(87) PCT Pub. No.: WO02/27780
  PCT Pub. Date: Apr. 4, 2002

(65) Prior Publication Data
US 2004/0000728 A1 Jan. 1, 2004

(30) Foreign Application Priority Data

| Sep. 29, 2000 | (JP) | 2000-297834 |
| Sep. 29, 2000 | (JP) | 2000-297835 |
| Oct. 11, 2000 | (JP) | 2000-311047 |
| Oct. 11, 2000 | (JP) | 2000-311048 |
| Oct. 11, 2000 | (JP) | 2000-311049 |
| Oct. 11, 2000 | (JP) | 2000-311050 |
| Oct. 11, 2000 | (JP) | 2000-311051 |

(51) Int. Cl.$^7$ .................................. H01L 23/29
(52) U.S. Cl. ............... 257/788; 257/789; 257/782; 257/783; 257/787
(58) Field of Search ............... 257/788, 789, 257/782, 783, 787

(56) References Cited

U.S. PATENT DOCUMENTS

| 5,959,363 A | 9/1999 | Yamada et al. ........ 257/787 |
| 6,064,111 A | 5/2000 | Sota et al. ............ 257/667 |
| 6,696,148 B1 * | 2/2004 | Seino et al. .......... 428/331 |

FOREIGN PATENT DOCUMENTS

| EP | 0 908 499 | 4/1999 | .......... C09J/183/04 |
| JP | 9-106999 | 4/1997 | .......... H01L/21/60 |

OTHER PUBLICATIONS

International Search Report.

* cited by examiner

Primary Examiner—Nathan J. Flynn
(74) Attorney, Agent, or Firm—Antonelli, Terry, Stout & Kraus, LLP

(57) ABSTRACT

A resin-sealed semiconductor device which comprises a lead frame having a die bond pad and an inner lead, a semiconductor chip installed on the die bond pad via a die bonding material and a sealing material for sealing the semiconductor chip and the lead frame, wherein properties of the die bonding material and the sealing material after curing satisfies the following formulae: $\sigma e \leq 0.2 \times \sigma b$ formula (1) $Ui \geq 2.0 \times 10^{-6} \times \sigma ei$ formula (2) $Ud \geq 4.69 \times 10^{-6} \times \sigma ed$ formula (3) wherein $\sigma b$ (MPa) represents the flexural strength at break of the sealing material at 25°, $Ui$ (N·m) and $Ud$ (N·m) represent shear strain energies of the sealing material at a soldering temperature for the inner lead and the die bonding pad, respectively, at a peak temperature during soldering, where $\sigma e = (1/\log(kd_1)) \times Ee_1 \times (\alpha m - \alpha e_1) \times \Delta T_1$ formula (4), $\sigma ei = Ee_2 \times (\alpha e_2 - \alpha m) \times \Delta T_2$ formula (5), $\sigma ed = \log(kd_2) \times Ee_2 \times (\alpha e_2 - \alpha m) \times \Delta T_2$ Formula (6), $kd_1$: a ratio of the flexural elastic modulus $Ed_1$ (MPa) of the die bonding material at 25° to 1 MPa of elastic modulus ($Ed_1 > 1$ MPa), $kd_2$: a ratio of the flexural elastic modulus $Ed_2$ (MPa) of the die bonding material at the peak temperature during the soldering to 1 MPa of elastic modulus ($Ed_2 > 1$ MPa), $Ee_1$: a flexural modulus (MPa) of the sealing material at 25°, $Ee_2$: a flexural modulus (MPa) of the sealing material at the peak temperature during soldering, $\alpha e_1$: an average thermal expansion coefficient (1/° C.) of the sealing material from forming temperature for the semiconductor to room temperature (25° C.), $\alpha e_2$: an average thermal expansion coefficient (1/° C.) of the sealing material from the forming temperature for the semiconductor to a peak temperature during soldering, $\alpha m$: a thermal expansion coefficient (1/° C.) of the lead frame, $\Delta T_1$: the difference (° C.) between the forming temperature for the semiconductor and the low temperature side temperature in the temperature cycle, and $\Delta T_2$: the difference (° C.) between the forming temperature for the semiconductor and the peak temperature during soldering.

24 Claims, 6 Drawing Sheets

CHIP WARPAGE AFTER CURING OF DIE BONDING MATERIAL

HIGH TEMPERATURE REFLOW, CRACK AND SEPARATION AFTER HEAT CYCLE

FIG.4

| | MATERIAL PROPERTY | CHIP WARPAGE | HEAT CYCLE RESISTANCE |
|---|---|---|---|
| ENCAPSULATING MATERIAL | σb (FLEXURAL STRENGTH) | | HIGHER IS BETTER |
| | α (COEFFICIENT OF THERMAL EXPANSION) | | CLOSER TO α VALUE OF LEAD FRAME IS BETTER |
| | E₁ (FLEXURAL ELASTIC MODULUS AT 25°C) | | LOWER IS BETTER |
| DIE BONDING MATERIAL | α (COEFFICIENT OF THERMAL EXPANSION) | NOT DEPENDENT | NOT DEPENDENT |
| | E₁ (FLEXURAL ELASTIC MODULUS AT 25°C) | LOWER IS BETTER | HIGHER IS BETTER |

RESIN-SEALED SEMICONDUCTOR DEVICE, AND DIE BONDING MATERIAL AND SEALING MATERIAL FOR USE THEREIN

CROSS REFERENCE TO RELATED APPLICATIONS

This application is based upon and claims the benefit of priority from prior Japanese Patent Application P2000-297834, P2000-297835, P2000-311047, P2000-311048, P2000-311049, P2000-311051, filed on Sep. 29, 2000; the entire contents of which are incorporated by reference herein.

BACKGROUND OF THE INVENTION

1. Field of the Invention

The present invention relates to a resin-sealed semiconductor device excellent in heat cycle resistance and mountability in which warpage deformation of a semiconductor chip is suppressed, and, particularly, relates to a resin-sealed semiconductor device using a copper lead frame and a die bonding material and an encapsulating material used therein.

2. Description of the Related Art

A semiconductor chip such as a LSI circuit is electrically joined with a lead frame and sealed by a encapsulating material for the purpose of protection from an external environment, thus taking the form of a package. Representative examples of the package include a dual inline package (DIP). The DIP is a pin-insertion type, which attaches a semiconductor device by inserting pins into a mounting substrate. Recently, due to requirements for miniaturization and higher functionality of an electronic itself in addition to high integration and higher speed of the LSI circuit, higher density mounting has been increasingly carried out. Therefore, in addition to the pin-insertion type package such as the DIP, a surface-mount package has come to be mainly used in high pin count application.

Representative examples of the surface-mount type package include a quad flat package (QFP). The QFP is designed to be directly fixed to a surface of the mounting substrate with solder or the like. The QFP has an advantage in that the package can be mounted on both sides of the mounting substrate, additionally, the package can be made thin to reduce an occupied space.

As shown in FIG. 1A, in the QFP, on a die bond pad 15 located at substantially center of the lead frame, a semiconductor chip 11 is mounted with a die bonding material 12 interposed therebetween. The chip 11 and a lead 16 are electrically connected with gold wires 14. The entire resultant structure is sealed with an encapsulating material 13 to be formed into a package (resin-sealed semiconductor device) 10. The package is then solder-mounted on a printed circuit board (not shown) to be used.

Problems in the process of manufacturing such a package, and in the subsequent mounting and usage phases are: a warpage of a chip after curing of the die bonding material, which is caused when the chip 11 is fixed to the pad 15, as shown in FIG. 1B, and a crack 17 and separation 18a and 18b within the package caused by high temperature reflow or a beat cycle in the mounting and usage phases, as shown in FIG. 1C.

The warpage of the chip in the package manufacturing process is caused by thermal stress due to a difference in physical property between the semiconductor chip 11 and the lead frame (die bond pad) 15. Particularly, in the case of using a lead frame of copper (Cu), the difference in coefficient of thermal expansion between the lead frame and the semiconductor chip is large, and warpage may be easily caused in the semiconductor chip 11. In the worst case, the semiconductor chip itself is broken. When the semiconductor chip 11 bonded to the lead frame is conveyed with warpage remaining through a rack, a jam is caused in conveying, and further a wiring error is caused in the subsequent step.

In the following mounting and usage phases, the package 10 is exposed to high temperature in reflowing when the package 10 is solder-mounted on a motherboard. In infrared reflow equipment or the like generally used for solder mounting, the semiconductor device is heated to up to 215–245° C. at highest. In the solder mounting, tin-lead eutectic solder was widely used. However, recently, since lead adversely affects the environment, lead-free solder, not using lead, has been increasingly developed. The lead-free solder generally has a higher melting point than that of the tin-lead eutectic solder. Accordingly, the semiconductor chip is heated up to 245–280° C. in solder mounting. In this reflow step, the adhesive force of the encapsulating material 13 to an inner lead 16a or the die bond pad 15 is lowered because of the thermal stress due to the heating and moisture absorption of the encapsulating material 13. When the adhesive force is lowered, the separation 18a is caused in an interface between the inner lead 16a and the encapsulating material 13, or the separation 18b is caused in an interface between the die bond pad 15 and the encapsulating material 13. The adhesion of copper to the encapsulating material after being subjected to the thermal history is severely lowered. In the case of using the copper lead frame, the effect thereof is serious.

FIG. 2 is an enlarged view showing the separation and the crack shown in FIG. 1C. As shown in FIG. 2A, when the semiconductor device is subjected to heat shock by repeated heat cycles in actual use, the crack 17 is caused in the encapsulating material 13 starting from an edge of the die bond pad 15. Such a crack is caused by thermal stress due to a difference in physical property among the component materials of the package. In the worst case, the crack may reach the surface of the resin-sealed semiconductor device. When the crack reaches the surface of the package, water goes through the crack, and moisture resistance reliability is lowered. As shown in FIG. 2B, the separation 18a between the inner lead 16a and the encapsulating material 13 causes a crack 19 in the gold wire 14 by the heat cycles subsequently repeated during use, and in the worst case, breaking of the wire may occur. On the other hand, the separation 18b between the die bond pad 15 and the encapsulating material 13 causes a crack 17 extending from a corner of the die bond pad 15 by the subsequent heat cycle.

As a countermeasure against the above-described problems, the following methods and the like have been proposed and implemented for the purpose of suppressing the reduction of the adhesive force due to the moisture absorption. In one method, the semiconductor device itself is packed in moisture-proof packing, and the package is opened just before surface mounting onto the motherboard for use. In another method, the semiconductor device is dried at 100° C. for 24 hours just before surface mounting, and then the solder mounting is carried out.

However, such preprocessing methods have problems in that they require a longer manufacturing process and take time and effort. The present invention is to solve these problems, and an object of the present invention is to provide a resin-sealed semiconductor device which overcomes the defects of the conventional QFP. The resin-sealed semiconductor device can reduce the warpage of the semiconductor chip after curing the die bonding material even in the case of using the Cu lead frame, and increase reliability of the connection between the inner lead and the die bond pad during solder mounting. Furthermore, the resin-sealed semiconductor device can suppress the crack starting from the edge of the die bond pad in the heat cycles.

SUMMARY OF THE INVENTION

In order to achieve the above-described object, one aspect of the present invention provides a resin-sealed semiconductor device, which includes a lead frame including a die bond pad and an inner lead, a semiconductor chip placed on the die bond pad with a die bonding material interposed therebetween, and a encapsulating material encapsulating the semiconductor chip and the lead frame, and properties of the die bonding material and the encapsulating material satisfy a certain relation. When a flexural strength of the encapsulating material at 25° C. is σb; a shear strain energy of the encapsulating material against the inner lead at a peak temperature during solder mounting is Ui; and a shear strain energy of the encapsulating material against the die bond pad at a peak temperature during solder mounting is Ud, the properties of the die bonding material and the encapsulating material after curing satisfy at least one of the following equations (1), (2), and (3).

$$\sigma e \leq 0.2 \times \sigma b \quad \text{equation (1)}$$

$$Ui \geq 2.0 \times 10^{-6} \times \sigma ei \quad \text{equation (2)}$$

$$Ud \geq 4.69 \times 10^{-6} \times \sigma ed \quad \text{equation (3)}$$

Here, $$\sigma e = (1/\log(kd_1)) \times Ee_1 \times (\alpha m - \alpha e_1) \times \Delta T_1 \quad \text{equation (4);}$$

$$\sigma ei = Ee_2 \times (\alpha e_2 - \alpha m) \times \Delta T_2 \quad \text{equation (5);}$$

$$\sigma ed = \log(kd_2) \times Ee_2 \times (\alpha e_2 - \alpha m) \times \Delta T_2 \quad \text{equation (6);}$$

$kd_1$: a ratio of the flexural elastic modulus $Ed_1$ (MPa) of the die bonding material at 25° C. to an elastic modulus of 1 MPa ($Ed_1$>1 MPa);

$kd_2$: a ratio of the flexural elastic modulus $Ed_2$ (MPa) of the die bonding material at the peak temperature during the solder mounting to an elastic modulus of 1 MPa ($Ed_2$>1 MPa);

$Ee_1$: a flexural elastic modulus (MPa) of the encapsulating material at 25° C.;

$Ee_2$: a flexural elastic modulus (MPa) of the encapsulating material at the peak temperature during the solder mounting;

$\alpha e_1$: an average coefficient of thermal expansion (1/° C.) of the encapsulating material from the formation temperature of the semiconductor device to 25° C.;

$\alpha e_2$: an average coefficient of thermal expansion (1/° C.) of the encapsulating material from the formation temperature of the semiconductor device to the peak temperature during the solder mounting;

$\alpha m$: a coefficient of thermal expansion (1/° C.) of the lead frame;

$\Delta T_1$: a temperature difference (° C.) between the formation temperature of the semiconductor device and a temperature on the low temperature side of the heat cycle; and $\Delta T_2$: a temperature difference (° C.) between the formation temperature of the semiconductor device and the peak temperature during the solder mounting.

Preferably, the flexural elastic modulus $Ed_1$ of the die bonding material at 25° C. is in a range of 1 MPa to 300 MPa. Accordingly, the warpage of the semiconductor chip at 25° C. after curing of the die bonding material can be effectively prevented.

Another aspect of the present invention provides a die bonding material which contains an inorganic filler of 20–85 wt %, a resin component, and a stress-reducing agent constituting 40–70 wt % of a total amount of the resin component, and the flexural elastic modulus at the peak temperature during the solder mounting is 70 MPa or less.

Still another aspect of the present invention provides an encapsulating material used for the resin-encapsulation of the semiconductor device which contains epoxy resin expressed by the following general formula (I) and an inorganic filler. Here, the content of the inorganic filler is 82–90 wt % of the total amount. In the general formula (I), t-Bu represents a tertiary butyl group.

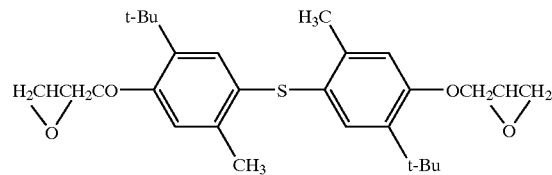

(I)

In the encapsulating material, the flexural elastic modulus at 25° C. is 26 GPa or less, the average coefficient of thermal expansion from the formation temperature of the semiconductor device to 25° C. is $0.7 \times 10^{-5}$/° C. or more; the flexural strength at 25° C. is 120 MPa or more; and the flexural elastic modulus at the peak temperature during the solder mounting is 650 MPa or less. The average coefficient of thermal expansion from the formation temperature of the semiconductor device to the peak temperature during the solder mounting is $5.0 \times 10^{-5}$/° C. or less; the shear strain energy of the encapsulating material against the inner lead at a peak temperature during solder mounting is $1.35 \times 10^{-6}$ N·m or more; and the shear strain energy of the encapsulating material against the die bond pad at a peak temperature during solder mounting is $6.8 \times 10^{-6}$ N·m or more.

Other characteristics and effects of the present invention will be further understood by embodiments to be described in detail below.

BRIEF DESCRIPTION OF THE DRAWINGS

FIG. 4 is a table showing the direction of physical properties of materials (die bonding material, encapsulating material) required for reducing the warpage of the chip and improving heat cycle resistance.

FIG. 5A shows a test piece used for the measurement. FIG. 5B shows the method of measuring a shear strain energy using the test piece. FIG. 5C is a graph showing the shear strain energy U obtained by integrating load F applied to the encapsulating material with respect to displacement x.

DETAILED DESCRIPTION OF EMBODIMENTS

Figure 1B:
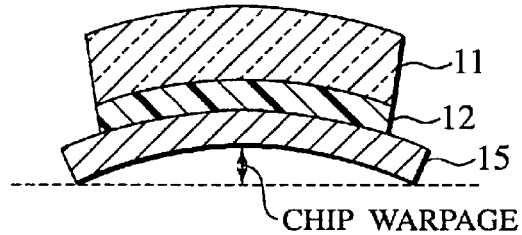
FIGS. 1A to 1C are views showing problems caused in processes of manufacturing, mounting and using a resin-sealed semiconductor device.
Figure 1A:
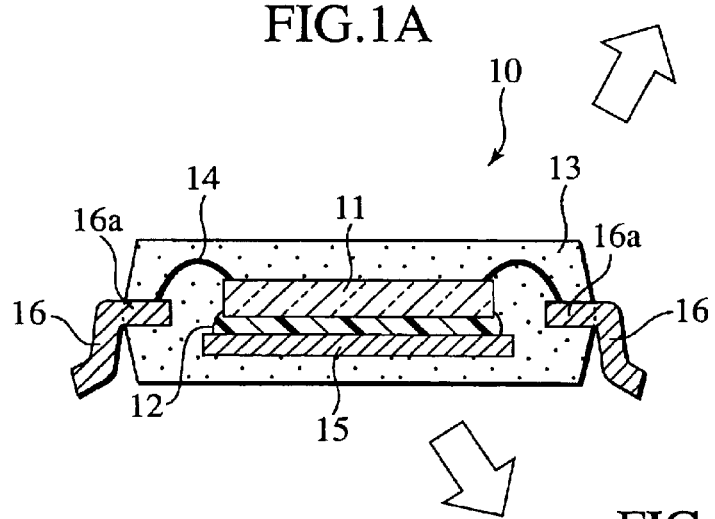
Figure 1C:
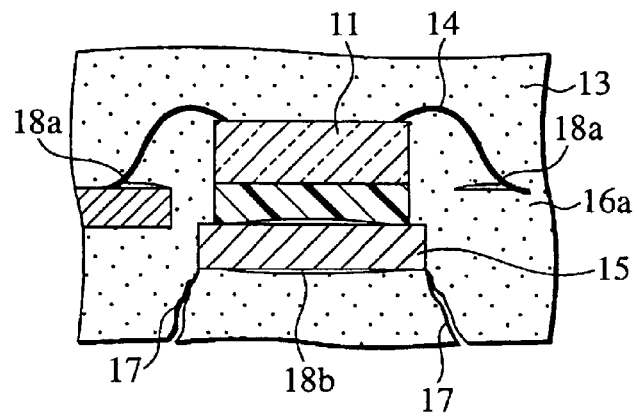
Figure 2A:
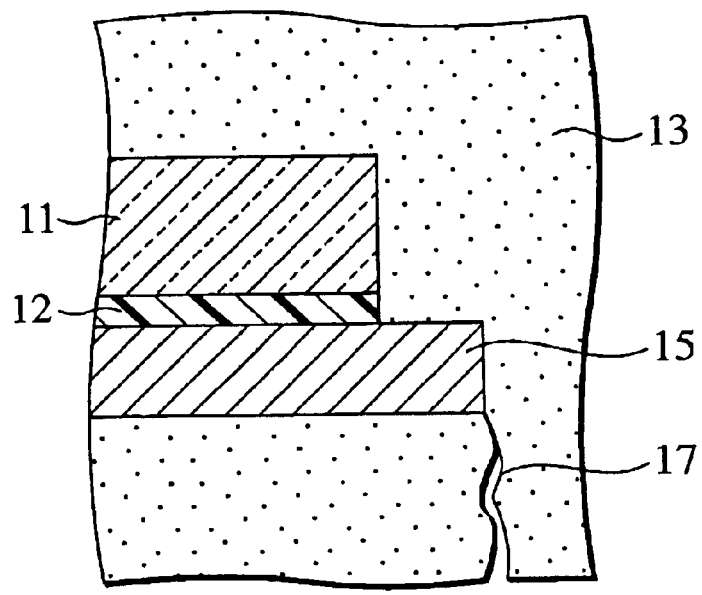
FIGS. 2A and 2B are views showing cracks and separation caused in the resin-sealed semiconductor device.
Figure 2B:
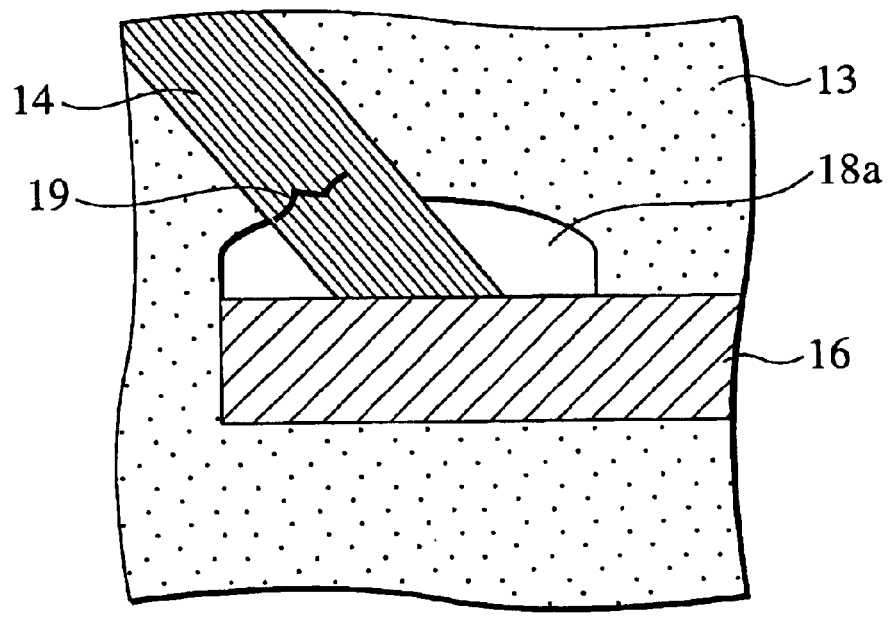

A description will be made of principles for solving the above-described problems of warpage of a chip, cracks, and separation of members before embodiments of the present invention will be described in detail.

Assuming that curing temperature and curing time of a die bonding material and outside dimensions of a semiconductor chip and a die bond pad remain constant, the warpage of the semiconductor chip at 25° C. after the chip is fixed on the die bond pad with the die bonding material interposed therebetween and cured is influenced by (1) elastic modulus of the die bonding material. As a result of various studies focusing on this influence, the inventors have found that among the elastic modulus of the die bonding material, flexural elastic modulus is a primary factor in the warpage of the chip and the warpage of the chip can be suppressed by setting the flexural elastic modulus of the die bonding material after curing, that is, at 25° C., to 300 MPa or less. A composition realizing the die bonding material with a flexural elastic modulus of 300 MPa or less will be described later in detail. However, the inventors have discovered that the die bonding material containing an inorganic filler of 20–85 wt %, a resin component, and a stress-reducing agent constituting 40 wt % or more of the resin component can minimize the warpage of the chip.

The crack caused in the edge of the die bond pad by heat shock due to a heat cycle, that is, repetition of low temperature and high temperature, is considered to be influenced by (2) thermal stress in the edge of the die bond pad and (3) flexural strength of the encapsulating material. As a result of various studies focusing on such influence, the inventors have found that the crack in the edge of the die bond pad caused in the heat cycle can be suppressed by setting the thermal stress of the edge of the die bond pad and the flexural strength of the encapsulating material to satisfy a certain relation. Compositions of the die bonding material and the encapsulating material satisfying this relation will be described later in detail. For the die bonding material, one containing an inorganic filler of 20–85 wt %, a resin component, and a stress reducing agent constituting 70 wt % or less of the resin component is used. For the encapsulating material, one having a flexural elastic modulus at 25° C. of 26 GPa or less, an average coefficient of thermal expansion from a formation temperature of the semiconductor device to 25° C. of $0.7 \times 10^{-5}/°$ C. or more, and a flexural strength at 25° C. of 120 MPa or more is used. The inventors have found that a combination of these die bonding and encapsulating materials can suppress the crack of the edge of the die bond pad caused in the heat cycle.

The separation of an inner lead portion and a die bond pad portion caused during solder mounting is considered to be influenced by (4) adhesivity of each portion and the encapsulating material after the encapsulating material absorbs moisture and (5) thermal stress caused by a difference in a material property between component materials of each of the die bonding and the encapsulating materials, and the lead frame. As a result of various studies focusing on such influences, the inventors have found that the separation of the inner lead portion and the die bond pad portion caused during the solder mounting can be suppressed when the adhesivity (shear strain energy) of each portion and the encapsulating material at a peak temperature during the solder mounting, after the moisture absorption and the thermal stress caused by the difference in the material property between the lead frame and each component material, satisfy a certain relation. Compositions of the die bonding material and the encapsulating material satisfying this relation will be described later in detail. For the die bonding material, one containing an inorganic filler of 20–85 wt %, a resin component, and a stress reducing agent constituting 40 wt % or more of the resin component is used. For the encapsulating material, one containing an inorganic filler of 82–90 wt % and epoxy resin represented by a particular chemical formula is used. The inventors have found that a combination of these materials can suppress the separation of each portion caused during the solder mounting.

As described above, in order to prevent the warpage of the chip, the crack and the separation in the entire processes of manufacturing, mounting on a printed circuit board, and using of the semiconductor device, and to maintain operational reliability of the semiconductor device, all of the following would be considered:

(1) flexural elastic modulus of the die bonding material at 25° C., (2) thermal stress in the edge of the die bond pad in the heat cycle, (3) flexural strength of the encapsulating material caused in the heat cycle, (4) shear strain energy between the encapsulating material and the lead frame (inner lead portion, die bond pad portion) during the solder mounting, (5) thermal stress in the interface between the encapsulating material and the lead frame (inner lead portion, die bond pad portion) during the solder mounting.

Hereinafter, these factors will be described in detail.

<Die Bonding Material for Reducing Warpage of a Semiconductor Device>

First, a description will be made of a point wherein the warpage of the semiconductor device is largely influenced by the elastic modulus of the die bonding material.

For the lead frame material (including the die bond pad portion and the inner lead portion) for use in the semiconductor device, generally, a copper alloy or an iron-nickel alloy is widely used. The coefficient of thermal expansion of the lead frame differs depending on the material used. For example, the coefficient of thermal expansion of a copper alloy is $1.7 \times 10^{-5}/°$ C., and that of an iron-nickel alloy is $0.5 \times 10^{-5}/°$ C. The warpage of the semiconductor chip is largely influenced by the coefficient of thermal expansion of the lead frame. The larger the difference in the coefficient of thermal expansion between the chip and the lead frame (especially, the die bond pad portion) is, the larger the influence is.

In the case of using an iron-nickel alloy for the lead frame, the difference in the coefficient of thermal expansion from the semiconductor chip is small, so that the warpage of the semiconductor chip is small and does not become a problem. However, considering electrical properties such as conductivity, operational properties, and heat release properties, request for using the lead frame of a copper alloy has being increased. However, in the case of using the lead frame of a copper alloy, the difference in the coefficient of thermal expansion from the semiconductor chip is large, so that the warpage of the semiconductor chip is large.

In the semiconductor device, when the semiconductor chip mainly composed of silicon is mounted on the lead frame of a copper alloy, the physical properties of the chip and the lead frame are substantially specified. Accordingly, by adjusting properties of the die bonding material bonding the semiconductor chip and the die bond pad, the warpage of the chip should be suppressed.

Figure 3:
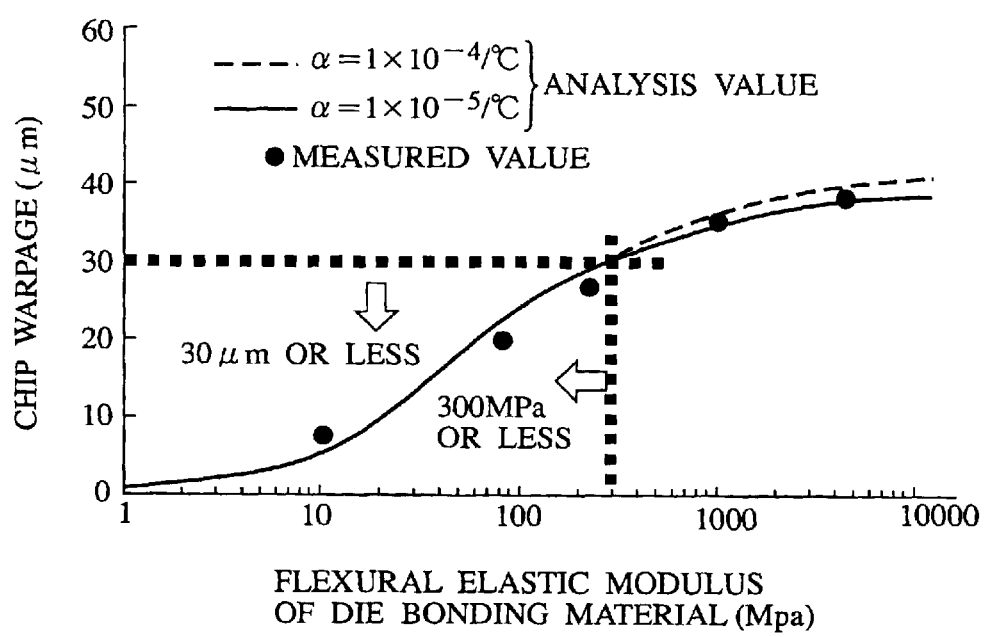
FIG. 3 is a graph showing a relation (25° C.) between the flexural elastic modulus (MPa) of a die bonding material after curing at 25° C. and warpage ($\mu$m) of a chip.

FIG. 3 shows the result of an examination on the relation between the warpage of the chip and the physical properties of the die bonding material using a commercially available warpage deformation analysis tool. From this result, it is understood that the warpage of the chip is scarcely influenced by the coefficient of thermal expansion of the die bonding material and largely influenced by the flexural elastic modulus. Actually, the chip of 8 mm×10 mm×0.28 mm was fixed on the die bond pad of the lead frame using the die bonding materials with different flexural elastic moduli under curing conditions of 150° C. for 1 hour, and the warpage of the chip was measured at 25° C. Since the measurement values agree well with the analysis result, regarding the warpage of the chip, it is sufficient to consider only the flexural elastic modulus of the die bonding material. The flexural elastic modulus of the die bonding material was measured in accordance with JIS-K-6911 at 25° C.

When the chip of 8 mm×10 mm is used as a test piece, the warpage of the chip up to about 30 μm does not affect functions or the a structure of the semiconductor chip. In order to control the warpage of the chip within a range of 30 μm or less, from the graph in FIG. 3, the flexural elastic modulus $Ed_1$ would be set to 300 MPa or less.

The die bonding material with a flexural elastic modulus $Ed_1$ of 300 MPa or less at 25° C. may be either in paste form or in film form. Preferably, as to the composition, the die bonding material contains an inorganic filler of 20–85 wt %, a resin component, and a stress-reducing agent constituting 40 wt % of the total amount of the resin component.

Examples of the inorganic filler include fused silica, crystalline silica, spherical silica, alumina, calcium carbonate, zirconium silicate, calcium silicate, talc, clay, mica, boron nitride, aluminum hydroxide, silver powder, copper powder or nickel powder. If the content of the inorganic filler in the die bonding material is less than 20 wt % or more than 85 wt %, workability is lowered in applying or sticking the die bonding material to the die bond pad portion.

Examples of the resin component suitably used include cresol novorac type epoxy resin, bisphenol F type epoxy resin, bisphenol AD type epoxy resin, and acrylic resin. The die bonding material also contains a curing agent and an accelerator in addition to the main ingredient. When needed, a coupling agent, reactive diluent, and the like are used in addition.

Examples of the stress-reducing agent include a butadiene-acrylonitrile base copolymer, a modified copolymer having an amino group, an epoxy group, or a carboxyl group on an end or a side chain thereof, a butadiene family flexibilizer such as an acrylonitrile-butadiene-styrene copolymer, silicone family elastomer having an amino group, a hydroxyl group, an epoxy group, or a carboxyl group on an end or a side chain thereof. The blending of the stress reducing agent can reduce the flexural elastic modulus of the die bonding material, thus reducing the warpage of the semiconductor chip in fixing the semiconductor chip to the die bond pad portion. Preferably, the composition of the stress reducing agent is set to 40 wt % or more of the total amount of the resin component. If the composition is less than 40 wt %, the flexural elastic modulus of the die bonding material cannot be sufficiently reduced, and the warpage of the semiconductor chip cannot be reduced.

In the die bonding material used in the present invention, an ion-trapping agent may be blended in addition to the stress-reducing agent. The use of the die bonding material with such a composition can suppress the warpage of the semiconductor chip caused after curing of the die bonding material.

The present invention is suitably applied to the resin-sealed semiconductor device particularly using a lead frame of a copper alloy. In the embodiment, particularly, it is preferable to use a lead frame of a copper alloy having a surface plated with any one of silver, gold, or palladium.

<Die Bonding Material and Encapsulating Material for Preventing a Crack in a Heat Cycle>

As described above, the crack caused by the heat cycle is influenced by thermal stress σ in the edge of the die bond pad and the flexural strength $\sigma_b$ of the encapsulating material.

The thermal stress σ in the edge of the die bond pad is expressed by the following equation when an elastic modulus of the encapsulating material at 25° C. is $Ee_1$, a coefficient of thermal expansion of the encapsulating material at 25° C. is $\alpha e_1$, and a coefficient of thermal expansion of the lead frame is αm. The subindex 1 of each parameter indicates that the parameter is on a low temperature side (25° C. or less).

$$\sigma = k \times \sigma e \qquad \text{equation (7)}$$

$$\sigma e = (1/\log(kd_1)) \times Ee_1 \times \alpha d \times \Delta T_1 \qquad \text{equation (8)}$$

$$\alpha d = \alpha m - \alpha e_1 \qquad \text{equation (9)}$$

Here, k: a coefficient depending on the package structure or the lead frame structure;

σe: a property represented by a physical property of the component material as an index of the thermal stress;

$kd_1$: a ratio of a flexural elastic modulus $Ed_1$ ($Ed_1 > 1$ MPa) of the die bonding material (after curing) at 25° C. to an elastic modulus of 1 MPa;

αd: a difference (αm−$\alpha e_1$) in the coefficient of thermal expansion between the lead frame and the encapsulating material; and $\Delta T_1$: a temperature difference between the formation temperature of the semiconductor device and the temperature in the low temperature side of the heat cycle.

From the equation (7), it is understood that the thermal stress σ caused in the edge of the die bond pad is proportional to the property σe.

On the other hand, the flexural strength σb (MPa) of the encapsulating material is obtained from the following equation by carrying out a flexural test in accordance with JIS-K-6911. The test piece is obtained by curing and shaping the encapsulating material into a predetermined size with a transfer press and post-curing at 175° C. for five hours.

$$\sigma b = (3 \times L \times P)/(2 \times W \times H^2) \qquad \text{equation (10)}$$

Here, L is a span (mm); P is a load (N); W is a width (mm) of the test piece; H is a thickness (mm) of the test piece; and the measurement temperature is a room temperature of 25° C.

In order to suppress the crack in the edge of the die bond pad caused in the heat cycle, it is necessary to increase the flexural strength σb of the encapsulating material and reduce the thermal stress caused in the die bond pad, that is, the property σe. However, even if the flexural strength σb is high, when the property σe is also large, the crack is caused in the edge of the die bond pad. Inversely, even if the flexural strength σb is somewhat low, when the property σe is also small, the crack is not caused in the edge of the die bond pad. Accordingly, it is important that the flexural strength σb and the property σe are set so as to be well balanced.

The inventors have made various studies on a relation between the flexural strength σb of the encapsulating material and the property σe and analyzed experimental examples to be described later. As a result, the inventors have discovered that a ratio (σe/σb) of the property σe to the flexural strength σb set to 0.2 or lower allows the crack in the edge of the die bond pad caused in the heat cycle to be suppressed.

In order to set the ratio (σe/σb) of the property σe to the flexural strength σb of the encapsulating material set to 0.2 or lower, as apparent from the equation (8), it is necessary to increase the flexural elastic modulus $Ed_1$ of the die bonding material, reduce the flexural elastic modulus $Ee_1$ of the encapsulating material, increase the coefficient $αe_1$ of thermal expansion of the encapsulating material, and increase the flexural strength σb of the encapsulating material. Specifically, as determined based on the analysis of the experiments to be described later, desirably, the flexural elastic modulus $Ed_1$ of the die bonding material is set to 1 MPa or more, the flexural elastic modulus $Ee_1$ of the encapsulating material is set to 26 GPa or less, the coefficient of thermal expansion $αe_1$ of the encapsulating material is set to $0.7 \times 10^{-5}/°$ C. or more, and the flexural strength σb of the encapsulating material is set to 120 MPa or more.

When the flexural strength of the encapsulating material is less than 120 MPa, the coefficient of thermal expansion thereof is less than $0.7 \times 10^{-5}/°$ C., and the flexural elastic modulus thereof is more than 26 GPa, in some cases, the ratio (σe/σb) of the property σe to the flexural strength σb is increased beyond 0.2. Accordingly, the crack cannot be sufficiently prevented.

The plating of the surface layer of the lead frame differs depending on the types of the lead frame. Since the crack in the edge of the die bond pad can be explained by the ratio (σe/σb) of the property σe to the flexural strength σb of the encapsulating material, the plating of the surface layer of the lead frame is not particularly limited. Accordingly, a plating of silver, gold, palladium, or the like can be generally used. Typically, a the lead frame having the inner lead portion with a length of 1 to 20 mm, a width of 0.1 to 1 mm, and a thickness of 0.1 to 0.5 mm and the die bond pad portion with an outside dimensions of 2 mm×2 mm to 20 mm×20 mm and a thickness of 0.1 to 0.5 mm is suitably used. For example, in some cases, only the inner lead portion is plated in order to improve a wire bonding property.

The flexural elastic module $Ee_1$ and $Ed_1$ of the encapsulating material and the die bonding material are obtained by preparing cured products of the encapsulating material and the die bonding material and carrying out tests in accordance with JIS-K-6911 at 25° C. The coefficient σe, of thermal expansion of the encapsulating material is calculated from a gradient from the formation temperature of the semiconductor device to 25° C. by preparing the cured product of the encapsulating material and carrying out measurement by use of a thermomechanical analyzer.

In the resin-sealed semiconductor device using the encapsulating material and the die bonding material satisfying the above-described relation σe/σb≦0.2, even if the semiconductor device is subjected to a severe heat shock such as that in the heat cycle, the crack in the edge of the die bond pad can be suppressed.

The die bonding material satisfying the above-described relation may be either in paste form or in film form. As to the composition, the die bonding material contains the inorganic filler of 20–85 wt %, the resin component, and the stress-reducing agent constituting 70 wt % or less of the total amount of the resin component. In addition, the curing agent and the accelerator are used, and the coupling agent, the reactive diluent, a solvent, and the like are used as needed. The ion-trapping agent may be blended therein. For materials of the inorganic filler and the stress reducing agent among these agents, the same materials as that of the inorganic filler and the stress-reducing agent used for the die bonding material described in connection with the warpage of the semiconductor device are used. The resin component may be typical resin. Among the resin, cresol novorac type epoxy resin, bisphenol F epoxy type resin, bisphenol AD type epoxy resin, and acrylic resin, are suitably used.

When the content of the inorganic filler is less than 20 wt % or more than 85 wt % of the total die bonding material, workability is lowered in applying and sticking the die bonding material to the die bond pad portion. On the other hand, the thermal stress of the die bond pad portion is influenced by the flexural elastic modulus of the die bonding material. As the flexural elastic modulus of the die bonding material is reduced, the thermal stress in the edge of the die bond pad is increased, and the relation σe/σb≦0.2 cannot be satisfied. Therefore, preferably, the content of the stress-reducing agent is set to 70 wt % or less of the total amount of the resin component excluding the solvent and the inorganic filler. The content of more than 70 wt % allows the flexural elastic modulus of the die bonding material to be considerably reduced and is effective for preventing the warpage of the chip, but the thermal stress in the edge of the die bond pad in the heat cycle cannot be reduced.

FIG. 4 is a table showing the direction of physical properties of materials (die bonding material, encapsulating material) required for reducing the warpage of the chip and improving heat cycle resistance. Since the warpage of the chip is caused before being sealed with resin, the parameters of the encapsulating materials are not concerned with the warpage of the chip. It is the properties of the die bonding material that have an influence on both the warpage of the chip and the heat cycle resistance. In order to control the warpage of the chip to be small, it is desirable that the flexural elastic modulus of the die bonding material is small. However, in the heat cycle, it is desirable that the flexural elastic modulus is large as described above. Accordingly, in order to maintain the reliability of a product after mounting the semiconductor chip on the die bond pad and in the heat cycle after encapsulating with the encapsulating material, the range of the flexural elastic modulus of the die bonding material needs to be optimally set.

Specifically, the flexural elastic modulus of the die bonding material is preferably 1 MPa or more but not exceeding 300 MPa. The die bonding material realizing such a flexural elastic modulus preferably contains the stress-reducing agent constituting 40 wt % or more but not exceeding 70 wt % of the total amount of the resin component.

On the other hand, the encapsulating material used in the present invention is generally in powder form or in tablet form. As long as the encapsulating material has a flexural elastic modulus of 26 GPa or less, a coefficient of thermal efficient of $0.7 \times 10^{-5}/°$ C. or more, and a flexural strength σb of 120 MPa or more, the main ingredient is not particularly limited. Examples thereof suitably used include biphenyl type epoxy resin and cresol novorac type epoxy resin. In the encapsulating material, the curing agent, the accelerator, and the inorganic filler are contained in addition to the main ingredient. As needed, a flame retardant, the coupling agent, wax, and the like are used in addition. In the encapsulating material used in the present invention, silicone oil, a rubber component such as silicone rubber and synthetic rubber may be blended, or the ion-trapping agent may be blended. The method of encapsulating the semiconductor chip by use of such a encapsulating material is not particularly limited. The semiconductor chip can be sealed by a known molding method such as the method carried out in a typical transfer molding or the like.

The resin-sealed semiconductor device thus obtained is excellent in resistance to the warpage of the semiconductor chip and the heat cycle resistance. Even when the resin-sealed semiconductor device is subjected to severe heat shock, the crack can be prevented from being caused from the edge of the die bond pad.

<Encapsulating Material and Die Bonding Material for Preventing Separation During Solder Mounting>

In the solder mounting, the separation in the interface between the inner lead portion and the encapsulating material and the separation in the interface between the die bond pad portion (rear face) and the encapsulating material becomes a problem. The separation is influenced by the adhesivity (shear strain energy) between each of the inner lead portion and the die bonding portion and the encapsulating material after the encapsulating material absorbs moisture and the thermal stress caused in the interface between each of these members and the encapsulating material. As described above, when the shear strain energy between each portion and the encapsulating material and the thermal stress satisfy a certain relation at a peak temperature during the solder mounting, the separation can be eliminated.

The thermal stress $\sigma i$ caused in the interface between the inner lead portion and the encapsulating material during the solder mounting is expressed by the following equation when an elastic modulus of the encapsulating material is $Ee_2$, a coefficient of thermal expansion of the encapsulating material is $\alpha e_2$, and a coefficient of thermal expansion of the lead frame is $\sigma m$. The subindex 2 of each parameter indicates that the parameter is on the high temperature side.

$$\sigma i = k \times \sigma ei \qquad \text{equation (11)}$$

$$\sigma ei = E e_2 \times \alpha d \times \Delta T_2 \qquad \text{equation (12)}$$

$$\alpha d = \alpha e_2 - \alpha m \qquad \text{equation (13)}$$

The thermal stress $\sigma d$ caused in the interface between the die bond pad portion and the encapsulating material is expressed by the following equation.

$$\sigma d = k \times \sigma ed \qquad \text{equation (14)}$$

$$\sigma ed = \log(kd_2) \times E e_2 \times \alpha d \times \Delta T_2 \qquad \text{equation (15)}$$

Here, k: a coefficient depending on the package structure or the lead frame structure;

$\sigma ei$, $\sigma ed$: properties represented by a physical property of the component materials as an index of the thermal stress;

$kd_2$: a ratio of a flexural elastic modulus $Ed_2$ ($Ed_2$>1 MPa) of the die bonding material at the peak temperature during the solder mounting to an elastic modulus of 1 MPa;

$\alpha d$: a difference ($\alpha m - \alpha e_1$) in the coefficient of thermal expansion between the encapsulating material and the lead frame on the high temperature side; and $\Delta T_2$: a temperature difference between the formation temperature of the semiconductor device and the peak temperature during the solder mounting.

The thermal stress caused in the inner lead portion is proportional to the property $\sigma ei$, and the thermal stress cased in the die bond pad portion is proportional to the property $\sigma ed$.

Figure 5A:
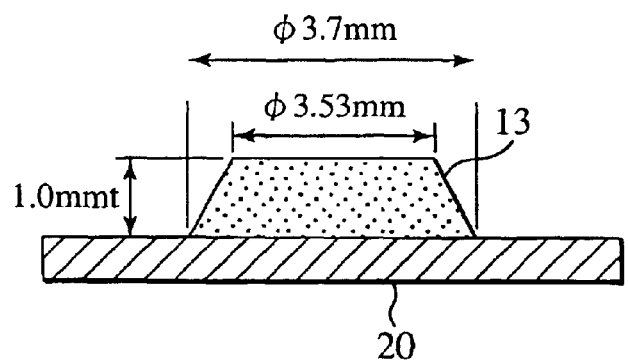
FIGS. 5A to 5C are views for explaining the measurement of reflow resistance of the encapsulating material.
Figure 5B:
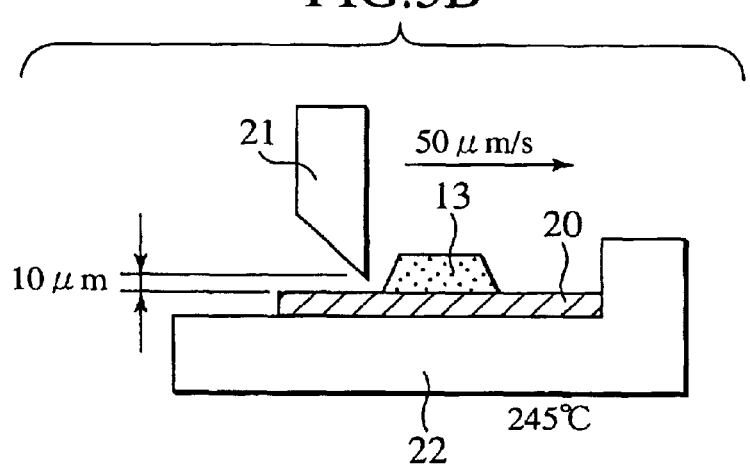

On the other hand, the shear strain energy U (N·m) at the peak temperature during the solder mounting between each of the inner lead portion and the die bond pad portion of the lead frame and the encapsulating material is obtained from a force (that is, load) applied to the encapsulating material in shearing and a displacement due to the force. Specifically, a test piece shown in FIG. 5A is prepared. After absorbing moisture under the predetermined conditions, as shown in FIG. 5B, the test piece is left for 20 seconds on a hot plate 22 of a shear adhesion strength tester set to the peak temperature during the solder mounting. Subsequently, while a test head 21 is moved at 50 μm/sec, load is applied to the encapsulating material 13, and the load F (N) and the displacement x (m) of the encapsulating material 13 are measured. The shear strain energy U is then obtained by the following equation.

$$U = \int F \cdot dx \qquad \text{equation (16)}$$

Figure 5C:
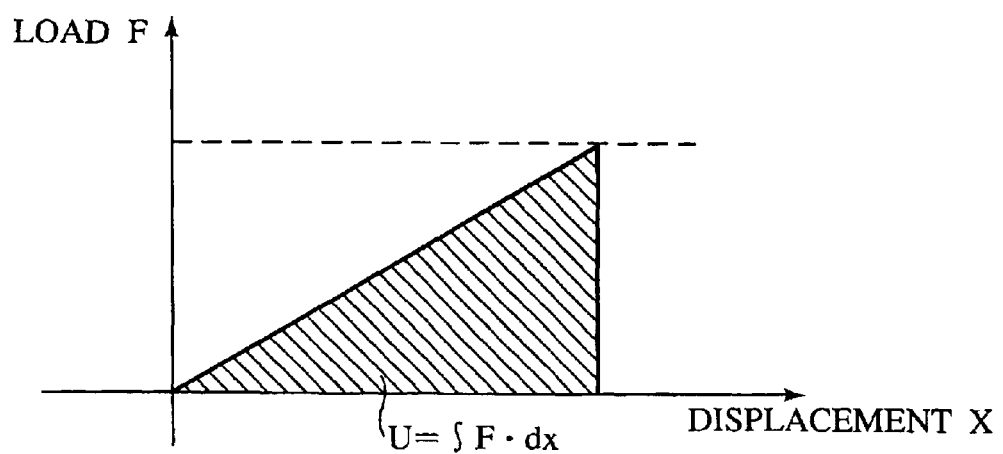

In other words, the shear strain energy U is obtained by integrating the load F with respect to the displacement x as shown by the shaded area in FIG. 5C.

The test piece shown in FIG. 5A is obtained in the following manner. The encapsulating material 13 is cured and formed into a size of 1 mm height and 3.7 mm diameter on the lead frame 20 by the transfer press, the lead frame 20 having the same material and the same plating specification as those of the inner lead portion or the die bond pad portion. The resultant structure is then post-cured at 175° C. for five hours.

When a moisture absorption time of the semiconductor device is t1 (h); a moisture absorption time of the test piece is t2 (h); a thickness of the encapsulating material from the surface of the semiconductor device to the inner lead portion or the die bond pad is h1 (mm); and a thickness of the encapsulating material of the test piece is h2 (mm), the following relational expression is obtained between these parameters using Fick's diffusion equation.

$$t1/t2 = 0.92 \times (h1/h2)^2 + 0.24 \qquad \text{equation (17)}$$

Figure 6:
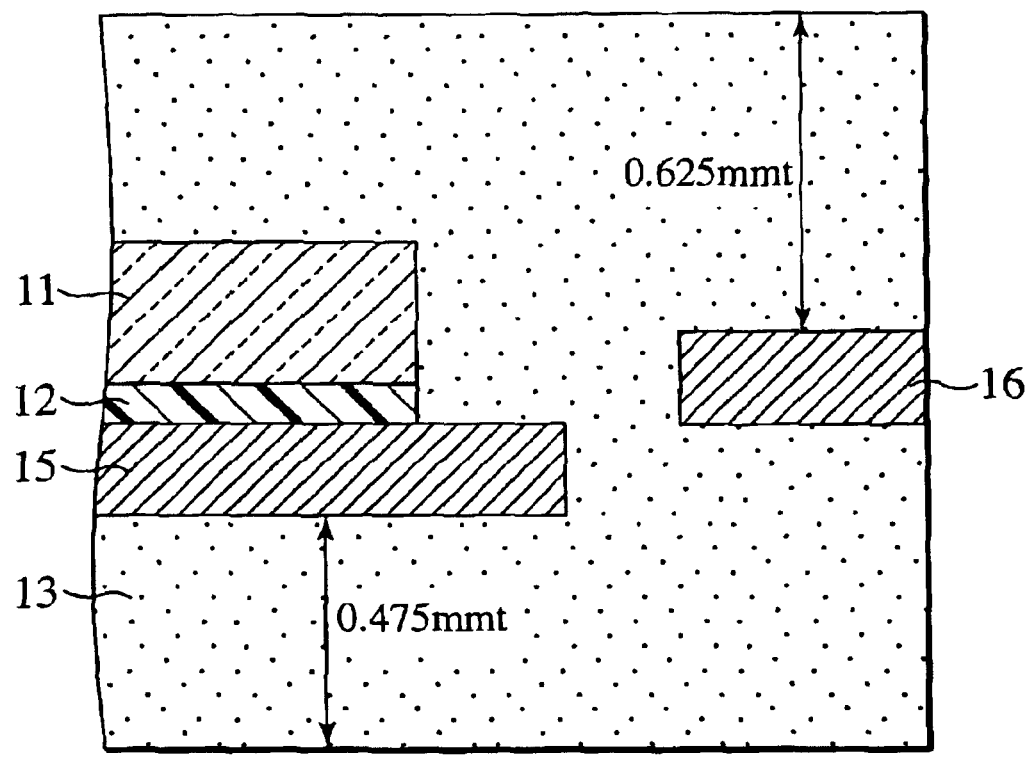
FIG. 6 is a partial cross-sectional view showing a resin-sealed semiconductor device used for analysis of reflow resistance.

The moisture absorption time t2 of the test piece is determined from this relational expression. For example, when the actual moisture absorption time t2 of the semiconductor device is 168 hours, the thickness h1 of the encapsulating material from the surface of the semiconductor device to the inner lead portion is 0.625 mm as shown in FIG. 6, and the thickness h2 of the encapsulating material of the test piece is 1.0 mm as shown in FIG. 5A, the moisture absorption time t2 of the test piece is determined to be about 280 hours from the equation (17).

In order to suppress the separation of the inner lead portion and the die bond pad portion caused during the solder mounting, it is necessary that the shear strain energy Ui of the encapsulating material against the inner lead portion and the shear strain energy Ud of the encapsulating material against the die bond pad portion are set high, and the properties $\sigma ei$ and $\sigma ed$ are set low. However, even if the shear strain energies Ui and Ud are high, when the properties $\sigma ei$ and $\sigma ed$ are also high, the separation may be caused in the inner lead portion and the die bond pad portion in some cases. On the other hand, even if the shear strain energies Ui and Ud is low, when the properties σei and σed are low, the separation may not be caused in the inner lead portion and the die bond pad portion in some cases. Accordingly, it is important that the shear strain energies Ui and Ud in the inner lead portion and the die bond pad portion and the corresponding properties σei and σed are set so as to be well balanced.

The inventors have made various studies on relations between the shear strain energies Ui (N·m) and Ud(N·m) and the properties σei and σed and performed an experimental analysis to be described later. As a result, it has been understood that the separation of the inner lead portion and the die bond pad portion caused during the solder mounting can be suppressed by setting as follows:

the ratio (Ui/σei) of the shear strain energy Ui to the property σei $\geq 2.0 \times 10^{-6}$, and the ratio (Ud/σed) of the shear strain energy Ud to the property σed $\geq 4.69 \times 10^{-6}$.

In order to set the ratio (Ui/σei) of the shear strain energy Ui to the property σei to $2.0 \times 10^{-6}$ or more and set the ratio (Ud/σed) of the shear strain energy Ud to the property σed to $4.69 \times 10^{-6}$ or more, the following conditions are derived from the result of the experimental analysis to be described later.

The flexural elastic modulus ($Ed_2$) of the die bonding material at the peak temperature during the solder mounting $\leq 70$ MPa.

The flexural elastic modulus ($Ee_2$) of the encapsulating material at the peak temperature during the solder mounting $\leq 650$ MPa.

The coefficient ($\alpha e_2$) of thermal expansion of the encapsulating material at the peak temperature during the solder mounting $\leq 5.0 \times 10^{-5}$/° C.

The shear strain energy (Ui) of the encapsulating material $\geq 1.35 \times 10^{-6}$ N·m. The shear strain energy (Ud) of the encapsulating material $\geq 6.8 \times 10^{-6}$ N·m.

In the resin-sealed semiconductor device manufactured using the die bonding material and the encapsulating material satisfying such conditions, even at high temperature such as during the solder mounting thereof onto the printed circuit board, the separation in the interface between the inner lead portion of the lead frame and the encapsulating material or the separation in the interface between the die bond pad portion and the encapsulating material can be effectively prevented. Accordingly, product reliability can be improved.

When the flexural elastic modulus of the die bonding material is more than 70 MPa, the flexural elastic modulus of the encapsulating material is more than 650 MPa, and the coefficient of thermal expansion of the encapsulating material is more than $5.0 \times 10^{-5}$/° C. at the peak temperature during the solder mounting, and the shear strain energy of the encapsulating material against the die bond pad portion is less than $6.8 \times 10^{-6}$ N·m, the ratio (Ud/σed) of the shear strain energy Ud to the property σed in the die bond pad portion becomes less than $4.69 \times 10^{-6}$. Accordingly, the separation of the die bond pad portion cannot be sufficiently suppressed.

Similarly, when the flexural elastic modulus of the encapsulating material is more than 650 MPa, the coefficient of thermal expansion of the encapsulating material is more than $5.0 \times 10^{-5}$/° C., and the shear strain energy of the encapsulating material against the inner lead portion is less than $1.35 \times 10^{-6}$ N·m, the ratio (Ui/σei) of the shear strain energy Ui to the property σei in the inner lead portion becomes less than $2.0 \times 10^{-6}$. Accordingly, the separation of the inner lead portion cannot be sufficiently suppressed.

The shear strain energy of the encapsulating material against the inner lead portion or the die bond pad portion varies depending on the plating of the surface layer of the lead frame. However, even in the case of different plating, the separation of the inner lead portion or the die bond pad portion can be explained by the ratio of the shear strain energy Ui and Ud to the properties σei and σed. Accordingly, the plating of the surface layer of the lead frame is not particularly limited and generally uses plating containing any one of silver, gold, or palladium.

The flexural elastic moduli of the die bonding material and the encapsulating material is obtained by preparing cured products of the die bonding material and the encapsulating material, and carrying out tests in accordance with JIS-K-6911 under the atmosphere of the peak temperature (for example, 245° C.) during the mounting. The coefficient of thermal expansion is calculated from a gradient from the formation temperature of the resin-sealed semiconductor device to the peak temperature during the solder mounting by preparing the cured product of the encapsulating material and carrying out measurements by use of the thermomechanical analyzer.

As previously described, the encapsulating material satisfying the above-described conditions is typically in powder form or in tablet form. For the main ingredient of the encapsulating material, although not particularly limited, biphenyl type epoxy resin, cresol novolac type epoxy resin, or the like is suitably used. Furthermore, epoxy resin expressed by the following general formula has a small flexural elastic modulus at high temperature and can reduce the thermal stress of the inner lead portion and the die bond pad portion.

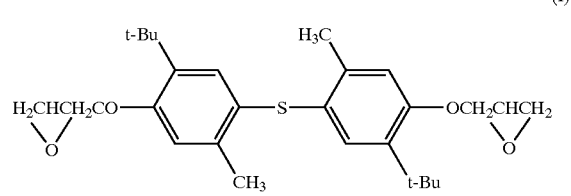

(I)

In the case of using the epoxy resin of the formula (I) in the encapsulating material, it is desirable that the encapsulating material contains the epoxy resin of 10 wt % or more of the total amount of the resin component in the encapsulating material, more preferably, 20 wt % or more. In the case of less than 10 wt %, sufficient low elasticity cannot be achieved, and the thermal stress in the inner lead portion and the die bond pad cannot be reduced.

The encapsulating material contains the curing agent, the accelerator, and the inorganic filler in addition to the main ingredient. As needed, a flame retardant, a coupling agent, wax or the like are used in addition. Preferably, the content of the inorganic filler is set to 80 wt % or more and less than 95 wt % of the total amount of the encapsulating material. Particularly, the range from 82 wt % to 90 wt % is preferred. When the content thereof is less than 80 wt %, since the saturated water absorption of the encapsulating material is increased, the shear adhesivity after the moisture absorption is reduced. Moreover, the coefficient of thermal expansion is increased, so that the thermal stress is increased. On the other hand, when the content thereof is more than 95 wt %, since the viscosity of the encapsulating material at the transfer molding is increased, wire sweep or molding defect may easily occur. Moreover, the flexural elastic modulus of the cured product of the encapsulating material is increased, so that the thermal stress is increased.

Moreover, in the encapsulating material, the stress-reducing agent such as silicone oil, silicone rubber, and synthetic rubber may be blended, and the ion-trapping agent may be blended. When the stress-reducing agent is blended, the elastic modulus of the encapsulating material can be reduced, and thus the thermal stress of each portion can be reduced. Preferably, the content of the stress-reducing agent is set to 5 wt % or more of the total amount of the resin component. The method of encapsulating the semiconductor chip by use of such a encapsulating material is not particularly limited. The semiconductor chip can be sealed by a known mold method such as the method carried out in a typical transfer molding or the like.

The die bonding material satisfying the above-described conditions is typically in paste form or in film form as described above. Preferably, the content of the inorganic filler is set to 20–85 wt % of the total amount of the die bonding material, and the content of the stress-reducing agent is set to 40 wt % of the total amount of the resin component.

The combination of the above-described die bonding material and encapsulating material allows for a semiconductor device excellent in resistance to the warpage of the semiconductor chip, heat cycle resistance, and solder mounting property.

EXAMPLES

Specific examples will be described below.

The raw materials shown in table 1 were used, and the encapsulating materials A to J were prepared in accordance with the compositions shown in table 2. On the other hand, the raw materials shown in table 3 were used, and the die bonding materials I to IV were prepared in accordance with compositions shown in table 4.

TABLE 1

| Raw materials for sealing material | |
|---|---|
| Raw material | Compound name |
| Epoxy resin | |
| 1 | ESCN-190-2 (cresol novolac type epoxy resin, trade name of Sumitomo Chemical Co., Ltd.,) |
| 2 | ESLV-210 (stilbene type epoxy resin, trade name of Sumitomo Chemical Co., Ltd.) |
| 3 | YSLV-120TE (sulfide type epoxy resin, trade name of Nippon Steel Chemical Co., Ltd.) |
| 4 | YX-4000H (biphenyl type epoxy resin, trade name of Yuka shell epoxy K. K.) |
| Curing agent | XL-225 (phenyl aralkyl resin, trade name of Mitsui Chemicals, Inc.) |
| Accelerator | adduct of triphenylphosphine and p-benzoquinone |
| Flame retardant | ESB-400T (brominated bisphenol A epoxy resin, trade name of Sumitomo Chemical Co., Ltd.) |
| Auxiliary flame retardant | antimony trioxide |
| Stress-reducing agent | silicone powder |
| Release agent | carnauba wax |
| Colorant | carbon black |
| Coupling agent | γ-glicidoxypropyltrimethoxy silane |
| Inorganic filler | spherical silica with average grain size of 17.5 μm |

TABLE 2

Composition of encapsulating material

| | Encapsulating material | | | | | | | | | |
|---|---|---|---|---|---|---|---|---|---|---|
| Raw material | A | B | C | D | E | F | G | H | I | J |
| Epoxy resin-1 | — | — | — | — | — | — | — | — | 85.0 | 42.5 |
| Epoxy resin-2 | — | — | — | — | — | — | — | — | — | 42.5 |
| Epoxy resin-3 | 85.0 | 85.0 | 85.0 | 85.0 | 85.0 | 85.0 | — | — | — | — |
| Epoxy resin-4 | — | — | — | — | — | — | 85.0 | 85.0 | — | — |
| Curing agent | 65.0 | 65.0 | 65.0 | 65.0 | 65.0 | 65.0 | 81.2 | 81.2 | 81.5 | 78.9 |
| Accelerator | 3.0 | 3.0 | 3.0 | 3.0 | 3.0 | 3.0 | 3.0 | 3.0 | 2.0 | 3.0 |
| Flame retardant | 15.0 | 15.0 | 15.0 | 15.0 | 15.0 | 15.0 | 15.0 | 15.0 | 15.0 | 15.0 |
| Auxiliary flame retardant | 6.0 | 15.0 | 6.0 | 15.0 | 6.0 | 15.0 | 6.0 | 6.0 | 6.0 | 6.0 |
| Stress reducing agent | — | 15.0 | — | 15.0 | — | 15.0 | — | — | — | — |
| Release agent | 1.0 | 1.0 | 1.0 | 1.0 | 1.0 | 1.0 | 1.0 | 1.0 | 1.0 | 1.0 |
| Colorant | 2.6 | 2.6 | 2.6 | 2.6 | 2.6 | 2.6 | 2.6 | 2.6 | 2.6 | 2.6 |
| Coupling agent | 7.5 | 7.5 | 7.5 | 7.5 | 7.5 | 7.5 | 7.5 | 7.5 | 7.5 | 7.5 |
| Inorganic filler (spherical form) | 740 | 800 | 1044 | 1129 | 1392 | 1505 | 1514 | 703 | 1132 | 1123 |

TABLE 3

| Raw materials for die bonding material | |
|---|---|
| Raw material | Compound name and property |
| Epoxy resin | |
| 1 | YDCN702S (cresol novolac type epoxy resin, trade name of Tohto Kasei Co., Ltd.) |
| 2 | EXA-830CRP (bisphenyl F type epoxy resin, trade name of DAINIPPON INK AND CHEMICALS, Inc.) |

TABLE 3-continued

Raw materials for die bonding material

| Raw material | Compound name and property |
|---|---|
| Curing agent | VR-9300 (phenol novolac resin, trade name of Mitsui Toatsu Chemicals, Inc.) |
| Accelerator | imidazoles |
| Stress-reducing agent | CTBNX-1009SP (carboxyl group terminated butadiene acrylonitrile rubber, trade name of Ube Industries, Ltd.) |
| Reactive diluent | t-butylphenylglycidyl ether (trade name of Asahi Denka Co., Ltd.) |
| Solvent | 2(2-ethoxyethoxy)ethyl acetate |
| Inorganic filler | grayish white silver powder of flakes |

TABLE 4

Composition of die bonding material

| Raw material | Die bonding material | | | |
|---|---|---|---|---|
| | I | II | III | IV |
| Epoxy resin-1 | — | — | — | 3 |
| Epoxy resin-2 | 22 | 13 | 7 | — |
| Curing agent | 3 | 3 | 3 | 1 |
| Accelerator | 1 | 1 | 1 | 1 |
| Stress-reducing agent | — | 9 | 15 | 9 |
| Reactive diluent | 6 | 6 | 6 | — |
| Solvent | — | — | — | 16 |
| Inorganic filler | 68 | 68 | 68 | 70 |

Using the die bonding material of each composition shown in Table 4, a semiconductor chip was arranged on the die bond pad of the lead frame and fixed by curing at 150° C. for 1 hour. The semiconductor chip had outside dimensions of 8.0 mm×10.0 mm and a thickness of 0.28 mm. A lead frame of a copper alloy with the tip of the inner lead portion plated with silver was used. The lead frame had a coefficient of thermal expansion of $1.7 \times 10^{-5}/°$ C. The inner lead portion had a length of 2 to 5.6 mm, a width of 0.185 mm, and a thickness of 0.15 mm, and the die bond pad portion had outside dimensions of 8.4 mm×10.4 mm and a thickness of 0.15 mm.

For each semiconductor chip thus obtained, warpage measurement of the semiconductor chip at 25° C. was carried out. The warpage of the semiconductor chip was measured by scanning 9 mm in the top face of the chip by use of a surface roughness tester. The results thereof are shown in tables 6 to 9 below.

Subsequently, using each encapsulating material shown in the table 2, the semiconductor chip was molded by transfer molding at 175° C. at 6.9 MPa for 90 seconds and then post-cured at 175° C. for five hours, thus obtaining a resin-sealed semiconductor device. The semiconductor device was an 80-pin QFP with outside dimensions of 14 mm×20 mm and a thickness of 1.4 mm. Specifically, the semiconductor device was the same as that shown in FIG. 6. The thickness of the encapsulating material from the surface thereof to the inner lead portion was 0.625 mm, and the thickness of the encapsulating material from the surface thereof to the die bond pad portion was 0.475 mm.

The combinations of the encapsulating materials A to J and the die bonding materials I to IV in preparing the semiconductor devices are shown in table 5. Five samples were prepared for each of the forty types, and the experiments on the respective types are shown as experimental examples 1 to 40.

TABLE 5

| Experimental example | 1 | 2 | 3 | 4 | 5 | 6 | 7 | 8 | 9 | 10 |
|---|---|---|---|---|---|---|---|---|---|---|
| Encapsulating material | A | B | C | D | E | F | G | H | I | J |
| Die bonding material | | | | | I | | | | | |
| Experimental example | 11 | 12 | 13 | 14 | 15 | 16 | 17 | 18 | 19 | 20 |
| Encapsulating material | A | B | C | D | E | F | G | H | I | J |
| Die bonding material | | | | | II | | | | | |
| Experimental example | 21 | 22 | 23 | 24 | 25 | 26 | 27 | 28 | 29 | 30 |
| Encapsulating material | A | B | C | D | E | F | G | H | I | J |
| Die bonding material | | | | | III | | | | | |
| Experimental example | 31 | 32 | 33 | 34 | 35 | 36 | 37 | 38 | 39 | 40 |
| Encapsulating material | A | B | C | D | E | F | G | H | I | J |
| Die bonding material | | | | | IV | | | | | |

Using each sample of the resin-sealed semiconductor device shown in Table 5, a solder mounting test and a heat cycle resistance test were carried out.

The solder mounting test was carried out at the peak temperature during the solder mounting of 245° C. with the number of cycles being three after being subjected to the moisture absorption at 85° C. and 85% RH for 168 hours in accordance with JEDEC (Joint Electron Device Engineering Council) LEVEL 1. The separation of the inner lead portion and the die bonding pad portion was then observed with an ultrasonic inspection and imaging instrument.

The heat cycle resistance test was in accordance with MIL standards (STD-883E condition C), and each semiconductor device was subjected to 1000 heat cycles, where exposure to 150° C. for 15 minutes and exposure to 65° C. for 15 minutes corresponds to one cycle. The crack in the edge of the die bond pad was observed by cross-sectional observation.

The tables 6 to 9 show the result of the measurement of the crack in the edge of the die bond pad portion after 1000 heat cycles, with the warpage of the semiconductor chip. The table 10 shows the result of measurement of the separation of the inner lead portion after the solder mounting test. Tables 11, 12 and 13 show the result of measuring the separation of the die bond pad after the solder mounting test. The shear strain energy of the inner lead portion and the encapsulating material was measured by setting the moisture absorption time of the test piece to 280 hours obtained by the equation (17) since the moisture absorption time of the semiconductor device was 168 hours, the thickness of the encapsulating material from the surface thereof to the inner lead portion was 0.625 mm, and the thickness of the encapsulating material of the test piece was 1.0 mm. Similarly, the shear strain energy of the die bond pad portion and the encapsulating material was measured by setting the moisture absorption time of the test piece to 375 hours obtained by the equation (17) since the moisture absorption time of the semiconductor device was 168 hours, the thickness of the encapsulating material from the surface thereof to the die bond pad portion was 0.475 mm, and the thickness of the encapsulating material of the test piece was 1.0 mm.

TABLE 6

Samples 1–10 (chip warpage, heat cycle resistance)

| | Experimental example | | | | | | | | | |
|---|---|---|---|---|---|---|---|---|---|---|
| | 1 | 2 | 3 | 4 | 5 | 6 | 7 | 8 | 9 | 10 |
| Coefficient $\alpha m$ of thermal expansion of lead frame ($\times 10^{-5}/°C$) | | | | | 1.7 | | | | | |
| Flexural elastic modulus $Ed_1$ of die bonding material (MPa) | | | | | 3753 | | | | | |
| Flexural elastic modulus $Ee_1$ of encapsulating material (MPa) | 18220 | 16460 | 22980 | 20600 | 25390 | 24750 | 25070 | 16560 | 24100 | 22310 |
| Coefficient $\alpha e_1$ of thermal expansion of encapsulating material ($\times 10^{-5}/°C$) | 1.37 | 1.26 | 1.07 | 0.92 | 0.79 | 0.74 | 0.74 | 1.46 | 1.05 | 1.07 |
| Flexural strength $\sigma b$ of encapsulating material (MPa) | 144.26 | 130.25 | 144.78 | 127.22 | 153.87 | 133.07 | 175.62 | 162.55 | 156.17 | 173.21 |
| Temperature difference $\Delta T_1$ (°C) | | | | | 240 | | | | | |
| $\sigma e$ (MPa) | 4.04 | 4.86 | 9.72 | 10.79 | 15.51 | 15.95 | 16.16 | 2.67 | 10.52 | 9.44 |
| $\sigma e/\sigma b$ | 0.03 | 0.04 | 0.07 | 0.08 | 0.1 | 0.12 | 0.09 | 0.02 | 0.07 | 0.05 |
| Number of samples causing cracking in die bond pad edge after heat cycle resistance test (/five samples) | 0 | 0 | 0 | 0 | 0 | 0 | 0 | 0 | 0 | 0 |
| Warpage amount of semiconductor chip after curing die bonding material ($\mu m$) | | | | | 40 | | | | | |

TABLE 7

Samples 11–20 (chip warpage, heat cycle resistance)

| | Experimental examle | | | | | | | | | |
|---|---|---|---|---|---|---|---|---|---|---|
| | 11 | 12 | 13 | 14 | 15 | 16 | 17 | 18 | 19 | 20 |
| Coefficient $\alpha m$ of thermal expansion of lead frame ($\times 10^{-5}/°C$) | | | | | 1.7 | | | | | |
| Flexural elastic modulus $Ed_1$ of die bonding material (MPa) | | | | | 874 | | | | | |
| Flexural elastic modulus $Ee_1$ of encapsulating material (MPa) | 18220 | 16460 | 22980 | 20600 | 25390 | 24750 | 25070 | 16560 | 24100 | 22310 |
| Coefficient $\alpha e_1$ of thermal expansion of encapsulating material ($\times 10^{-5}/°C$) | 1.37 | 1.26 | 1.07 | 0.92 | 0.79 | 0.74 | 0.74 | 1.46 | 1.05 | 1.07 |
| Flexural strength $\sigma b$ of encapsulating material (MPa) | 144.26 | 130.25 | 144.78 | 127.22 | 153.87 | 133.07 | 175.62 | 162.55 | 156.17 | 173.21 |
| Temperature difference $\Delta T_1$ (°C) | | | | | 240 | | | | | |
| $\sigma e$ (MPa) | 4.91 | 5.91 | 11.81 | 13.11 | 18.85 | 19.39 | 19.64 | 3.24 | 12.78 | 11.47 |
| $\sigma e/\sigma b$ | 0.03 | 0.05 | 0.08 | 0.10 | 0.12 | 0.15 | 0.11 | 0.02 | 0.08 | 0.07 |
| Number of samples causing cracking in die bond pad edge after heat cycle resistance test (/five samples) | 0 | 0 | 0 | 0 | 0 | 0 | 0 | 0 | 0 | 0 |

TABLE 7-continued

Samples 11–20 (chip warpage, heat cycle resistance)

| | Experimental examle | | | | | | | | | |
|---|---|---|---|---|---|---|---|---|---|---|
| | 11 | 12 | 13 | 14 | 15 | 16 | 17 | 18 | 19 | 20 |
| Warpage amount of semiconductor chip after curing die bonding material (μm) | | | | | 39 | | | | | |

TABLE 8

Samples 21–30 (chip warpage, heat cycle resistance)

| | Experimental example | | | | | | | | | |
|---|---|---|---|---|---|---|---|---|---|---|
| | 21 | 22 | 23 | 24 | 25 | 26 | 27 | 28 | 29 | 30 |
| Coefficient $\alpha m$ of thermal expansion of lead frame ($\times 10^{-5}$/° C.) | | | | | 1.7 | | | | | |
| Flexural elastic modulus $Ed_1$ of die bonding material (MPa) | | | | | 201 | | | | | |
| Flexural elastic modulus $Ee_1$ of encapsulating material (MPa) | 18220 | 16460 | 22980 | 20600 | 25390 | 24750 | 25070 | 16560 | 24100 | 22310 |
| Coefficient $\alpha e_1$ of thermal expansion of encapsulating material ($\times 10^{-5}$/° C.) | 1.37 | 1.26 | 1.07 | 0.92 | 0.79 | 0.74 | 0.74 | 1.46 | 1.05 | 1.07 |
| Flexural strength $\sigma b$ of encapsulating material (MPa) | 144.26 | 130.25 | 144.78 | 127.22 | 153.87 | 133.07 | 175.62 | 162.55 | 156.17 | 173.21 |
| Temperature difference $\Delta T_1$ (° C.) | | | | | 240 | | | | | |
| $\sigma e$ (MPa) | 6.27 | 7.55 | 15.09 | 16.74 | 24.08 | 24.76 | 25.08 | 4.14 | 16.32 | 14.65 |
| $\sigma e/\sigma b$ | 0.04 | 0.06 | 0.10 | 0.13 | 0.16 | 0.19 | 0.14 | 0.03 | 0.10 | 0.08 |
| Number of samples causing cracking in die bond pad edge after heat cycle resistance test (/five samples) | 0 | 0 | 0 | 0 | 0 | 0 | 0 | 0 | 0 | 0 |
| Warpage amount of semiconductor chip after curing die bonding material (μm) | | | | | 28 | | | | | |

TABLE 9

Samples 31–40 (chip warpage, heat cycle resistance)

| | Experimental example | | | | | | | | | |
|---|---|---|---|---|---|---|---|---|---|---|
| | 31 | 32 | 33 | 34 | 35 | 36 | 37 | 38 | 39 | 40 |
| Coefficient $\alpha m$ of thermal expansion of lead frame ($\times 10^{-5}$/° C.) | | | | | 1.7 | | | | | |
| Flexural elastic modulus $Ed_1$ of die bonding material (MPa) | | | | | 9.5 | | | | | |
| Flexural elastic modulus $Ee_1$ of encapsulating material (MPa) | 18220 | 16460 | 22980 | 20600 | 25390 | 24750 | 25070 | 16560 | 24100 | 22310 |
| Coefficient $\alpha e_1$ of thermal expansion of encapsulating material ($\times 10^{-5}$/° C.) | 1.37 | 1.26 | 1.07 | 0.92 | 0.79 | 0.74 | 0.74 | 1.46 | 1.05 | 1.07 |

TABLE 9-continued

Samples 31–40 (chip warpage, heat cycle resistance)

| | Experimental example | | | | | | | | | |
|---|---|---|---|---|---|---|---|---|---|---|
| | 31 | 32 | 33 | 34 | 35 | 36 | 37 | 38 | 39 | 40 |
| Flexural strength σb of encapsulating material (MPa) | 144.26 | 130.25 | 144.78 | 127.22 | 153.87 | 133.07 | 175.62 | 162.55 | 156.17 | 173.21 |
| Temperature difference $\Delta T_1$ (° C.) | | | | | 240 | | | | | |
| σe (MPa) | 14.76 | 17.78 | 35.54 | 39.44 | 56.72 | 58.32 | 59.08 | 9.76 | 38.45 | 34.50 |
| σe/σb | 0.10 | 0.14 | 0.25 | 0.31 | 0.37 | 0.44 | 0.34 | 0.06 | 0.25 | 0.20 |
| Number of samples causing cracking in die bond pad edge after heat cycle resistance test (/five samples) | 0 | 0 | 5 | 5 | 5 | 5 | 5 | 0 | 5 | 0 |
| Warpage amount of semiconductor chip after curing die bonding material (μm) | | | | | 8 | | | | | |

TABLE 10

Samples 1–10 (separation of inner lead portion)

| | Experimental example | | | | | | | | | |
|---|---|---|---|---|---|---|---|---|---|---|
| | 1 | 2 | 3 | 4 | 5 | 6 | 7 | 8 | 9 | 10 |
| Coefficient αm of thermal expansion of lead frame (×10$^{-5}$/° C.) | | | | | 1.7 | | | | | |
| Flexural elastic modulus Ed$_2$ of die bonding material (MPa) | | | | | 102.8 | | | | | |
| Flexural elastic modulus Ee$_2$ of encapsulating material (MPa) | 264 | 221 | 402 | 255 | 637 | 448 | 1351 | 576 | 644 | 809 |
| Coefficient αe$_2$ of thermal expansion of encapsulating material (×10$^{-5}$/° C.) | 5.56 | 5.93 | 4.54 | 4.78 | 3.49 | 3.61 | 3.15 | 5.49 | 4.22 | 4.21 |
| Shear strain energy Ui (×10$^{-6}$ N · m) | 0.10 | 0.71 | 2.77 | 1.35 | 1.60 | 5.75 | 2.35 | 0.35 | 0.57 | 0.29 |
| Temperature difference $\Delta T_2$ (° C.) | | | | | 70 | | | | | |
| σei (MPa) | 0.71 | 0.65 | 0.80 | 0.55 | 0.80 | 0.60 | 1.37 | 1.53 | 1.14 | 1.42 |
| Ui/σei (×10$^{-6}$) | 0.14 | 1.08 | 3.47 | 2.46 | 2.00 | 9.60 | 1.71 | 0.23 | 0.5 | 0.2 |
| Number of samples causing separation of inner lead portion after solder mounting test (/five samples) | 5 | 5 | 0 | 0 | 0 | 0 | 5 | 5 | 5 | 5 |

TABLE 11

Samples 1–10 (separation of die bond pad portion)

| | Experimental example | | | | | | | | | |
|---|---|---|---|---|---|---|---|---|---|---|
| | 1 | 2 | 3 | 4 | 5 | 6 | 7 | 8 | 9 | 10 |
| Coefficient $\alpha m$ of thermal expansion of lead frame ($\times 10^{-5}$/° C.) | | | | | 1.7 | | | | | |
| Flexural elastic modulus $Ed_2$ of die bonding material (MPa) | | | | | 102.8 | | | | | |
| Flexural elastic modulus $Ee_2$ of encapsulating material (MPa) | 264 | 221 | 402 | 255 | 637 | 448 | 1351 | 576 | 644 | 809 |
| Coefficient $\alpha e_2$ of thermal expansion of encapsulating material ($\times 10^{-5}$/° C.) | 5.56 | 5.93 | 4.54 | 4.78 | 3.49 | 3.61 | 3.15 | 5.49 | 4.22 | 4.21 |
| Shear strain energy Ud ($\times 10^{-6}$ N · m) | 0.50 | 2.70 | 22.16 | 17.55 | 20.80 | 24.01 | 31.70 | 1.32 | 6.79 | 12.38 |
| Temperature difference $\Delta T_2$ (° C.) | | | | | 70 | | | | | |
| $\sigma$ed (MPa) | 1.44 | 1.32 | 1.61 | 1.11 | 1.61 | 1.21 | 2.76 | 3.07 | 2.29 | 2.86 |
| Ud/$\sigma$ed ($\times 10^{-6}$) | 0.35 | 2.05 | 13.78 | 15.87 | 12.95 | 19.92 | 11.49 | 0.43 | 2.97 | 4.33 |
| Number of samples causing separation of inner lead portion after solder mounting test (/five samples) | 3 | 4 | 0 | 0 | 0 | 0 | 0 | 5 | 4 | 4 |

TABLE 12

Samples 11–20 (separation of die bond pad portion)

| | Experimental example | | | | | | | | | |
|---|---|---|---|---|---|---|---|---|---|---|
| | 1 | 2 | 3 | 4 | 5 | 6 | 7 | 8 | 9 | 10 |
| Coefficient $\alpha m$ of thermal expansion of lead frame ($\times 10^{-5}$/° C.) | | | | | 1.7 | | | | | |
| Flexural elastic modulus $Ed_2$ of die bonding material (MPa) | | | | | 74.7 | | | | | |
| Flexural elastic modulus $Ee_2$ of encapsulating material (MPa) | 264 | 221 | 402 | 255 | 637 | 448 | 1351 | 576 | 644 | 809 |
| Coefficient $\alpha e_2$ of thermal expansion of encapsulating material ($\times 10^{-5}$/° C.) | 5.56 | 5.93 | 4.54 | 4.78 | 3.49 | 3.61 | 3.15 | 5.49 | 4.22 | 4.21 |
| Shear strain energy Ud ($\times 10^{-6}$ N · m) | 0.50 | 2.70 | 22.16 | 17.55 | 20.80 | 24.01 | 31.70 | 1.32 | 6.79 | 12.38 |
| Temperature difference $\Delta T_2$ (° C.) | | | | | 70 | | | | | |
| $\sigma$ed (MPa) | 1.34 | 1.23 | 1.50 | 1.03 | 1.50 | 1.12 | 2.57 | 2.86 | 2.13 | 2.66 |
| Ud/$\sigma$ed ($\times 10^{-6}$) | 0.37 | 2.20 | 14.80 | 17.04 | 13.91 | 21.40 | 12.34 | 0.46 | 3.19 | 4.65 |

TABLE 12-continued

Samples 11–20 (separation of die bond pad portion)

| | Experimental example | | | | | | | | | |
|---|---|---|---|---|---|---|---|---|---|---|
| | 1 | 2 | 3 | 4 | 5 | 6 | 7 | 8 | 9 | 10 |
| Number of samples causing separation of inner lead portion after solder mounting test (/five samples) | 4 | 4 | 0 | 0 | 0 | 0 | 0 | 4 | 4 | 3 |

TABLE 13

Samples 21–30 (separation of die bond pad portion)

| | Experimental example | | | | | | | | | |
|---|---|---|---|---|---|---|---|---|---|---|
| | 1 | 2 | 3 | 4 | 5 | 6 | 7 | 8 | 9 | 10 |
| Coefficient $\alpha m$ of thermal expansion of lead frame ($\times 10^{-5}/°$ C.) | | | | | 1.7 | | | | | |
| Flexural elastic modulus $Ed_2$ of die bonding material (MPa) | | | | | 18.8 | | | | | |
| Flexural elastic modulus $Ee_2$ of encapsulating material (MPa) | 264 | 221 | 402 | 255 | 637 | 448 | 1351 | 576 | 644 | 809 |
| Coefficient $\alpha e_2$ of thermal expansion of encapsulating material ($\times 10^{-5}/°$ C.) | 5.56 | 5.93 | 4.54 | 4.78 | 3.49 | 3.61 | 3.15 | 5.49 | 4.22 | 4.21 |
| Shear strain energy Ud ($\times 10^{-6}$ N · m) | 0.50 | 2.70 | 22.16 | 17.55 | 20.80 | 24.01 | 31.70 | 1.32 | 6.79 | 12.38 |
| Temperature difference $\Delta T_2$ (° C.) | | | | | 70 | | | | | |
| $\sigma ed$ (MPa) | 0.91 | 0.83 | 1.02 | 0.70 | 1.02 | 0.76 | 1.75 | 1.95 | 1.45 | 1.81 |
| Ud/$\sigma ed$ ($\times 10^{-6}$) | 0.55 | 3.24 | 21.76 | 25.05 | 20.45 | 31.46 | 18.14 | 0.68 | 4.69 | 6.84 |
| Number of samples causing separation of inner lead portion after solder mounting test (/five samples) | 3 | 1 | 0 | 0 | 0 | 0 | 0 | 4 | 0 | 0 |

From the tables 6 to 9, the smaller the flexural elastic modulus ($Ed_1$) of the die bonding material at 25° C. is, the smaller the warpage of the semiconductor chip after curing the die bonding material, and the semiconductor chip remains good.

Similarly, from the tables 6 to 9, as for the number of samples causing the crack in the edge of the die bond pad after the heat cycle resistance test, it is shown that when the value of the parameter ratio ($\sigma e/\sigma d$) of the equation (1) is 0.2 or less, the crack is not caused, and the semiconductor device remains good. On the other hand, in each of the experimental examples 33 to 37, and 39 in the table 9, the parameter ratio ($\sigma e/\sigma d$) is more than 0.2, and the crack is caused in each of the five samples of each experimental example. The result shows that the control of the parameter ratio ($\sigma e/\sigma d$) to 0.2 or less allows to realize a semiconductor device which has no cracks and remains good even after the repetition of the severe heat cycles.

From the table 10, as for the separation of the inner lead portion after the solder mounting test, when the value of the parameter ratio (Ui/$\sigma ei$) of the equation (2) concerning the encapsulating material is more than $2.0 \times 10^{-6}$, the separation of the inner lead portion is not caused. On the other hand, as in experimental examples such as 1, 2, 7, 8, 9 and 10, when the parameter ratio (Ui/$\sigma ei$) is less than $2.0 \times 10^{-6}$, the separation is caused between the encapsulating material and the inner lead portion.

As for the separation between the die bond pad portion and the encapsulating material, as shown in the tables 11, 12 and 13, when the value of the parameter ratio (Ud/$\sigma ed$) of the equation (3) is more than $4.69 \times 10^{-6}$, the separation is not caused in the die bond pad portion after the solder mounting test and the semiconductor device remains good. On the other hand, as shown in the experimental examples 1, 2, 8, 9, 10, 11, 12, 18, 19, 20, 21, 22 and 28, when the parameter ratio (Ud/$\sigma ed$) is less than $4.69 \times 10^{-6}$, the separation is caused in the die bond pad portion. At the time when the semiconductor device is solder mounted on the printed circuit board or the like, the defect is generated.

From these experimental results, the combinations of die bonding materials and the encapsulating materials which are considered to be excellent in resistance to the warpage of the semiconductor chip, heat cycle resistance, and mountability, the samples 23, 24, 25 and 26 are selected from the samples shown in the table 5, and the warpage of the semiconductor device, heat cycle resistance, and mountability ware continuously measured for these samples. The results thereof are shown in table 14.

TABLE 14

| | | Example | | | |
|---|---|---|---|---|---|
| | | 1 | 2 | 3 | 4 |
| | | | Experimental Example | | |
| | | Experimental example 23 | Experimental example 24 | Experimental example 25 | Experimental example 26 |
| Coefficient αm of thermal expansion of lead frame ($\times 10^{-5}$/° C.) | | | 1.7 | | |
| Flexural elastic modulus of die bonding material | $Ed_1$ (MPa) | | 201 | | |
| | $Ed_2$ (MPa) | | 18.8 | | |
| Flexural elastic modulus of encapsulating material | $Ee_1$ (MPa) | 22980 | 20600 | 25390 | 24750 |
| | $Ee_2$ (MPa) | 402 | 255 | 637 | 448 |
| Coefficient of thermal expansion of encapsulating material | $\alpha e_1$ ($\times 10^{-5}$/° C.) | 1.07 | 0.92 | 0.79 | 0.74 |
| | $\alpha e_2$ ($\times 10^{-5}$/° C.) | 4.54 | 4.78 | 3.49 | 3.61 |
| Flexural strength of encapsulating material | σb (MPa) | 144.78 | 127.22 | 153.87 | 133.07 |
| Shear strain energy | Ui ($\times 10^{-6}$ N · m) | 2.77 | 1.35 | 1.60 | 5.75 |
| | Ud ($\times 10^{-6}$ N · m) | 22.16 | 17.55 | 20.80 | 24.01 |
| Temperature difference $\Delta T_1$ (° C.) | | | 240 | | |
| Temperature difference $\Delta T_2$ (° C.) | | | 70 | | |
| σe (MPa) | | 15.09 | 16.74 | 24.08 | 24.76 |
| σei (MPa) | | 0.80 | 0.55 | 0.80 | 0.60 |
| σed (MPa) | | 1.02 | 0.70 | 1.02 | 0.76 |
| σe/σb | | 0.10 | 0.13 | 0.16 | 0.19 |
| Ui/σei ($\times 10^{-6}$) | | 3.47 | 2.46 | 2.00 | 9.60 |
| Ud/σed ($\times 10^{-6}$) | | 21.76 | 25.05 | 20.45 | 31.46 |
| Warpage amount of semiconductor chip after curing die bonding material (μm) | | | 28 | | |
| Number of samples causing cracking in die bond pad edge after heat cycle resistance test (/five samples) | | 0 | 0 | 0 | 0 |
| Number of samples causing separation of inner lead portion after solder mounting test (/five samples) | | 0 | 0 | 0 | 0 |
| Number of samples causing separation of die bond pad portion after solder mounting test (/five samples) | | 0 | 0 | 0 | 0 |

Each of these four examples satisfies the following conditions:

the parameter ratio (σe/σb) concerning the crack in the edge of the die bond pad caused in the heat cycle is 0.2 or less;

the parameter ratio (Ui/σei) concerning the separation of the inner lead portion after the solder mounting test is $2.0 \times 10^{-6}$ or more; and the parameter ratio (Ud/σed) concerning the separation of the die bond pad portion after the solder mounting test is $4.69 \times 10^{-6}$ or more. With the combination of these die bonding materials and encapsulating materials, the warpage of the chip is reduced and the crack in the edge of the die bond pad, the separation of the die bond pad portion, and the separation of the inner lead portion are eliminated, thus obtaining a resin-sealed semiconductor device excellent in heat cycle resistance and mountability.

From these results, the optimal physical properties of the die bonding material and the encapsulating materials can be specified as follows.

Specifically, the flexural elastic modulus of the die bonding material at 25° C. after curing is in the range of 1 to 300 MPa, and the properties of the die bonding material and the encapsulating materials after curing are:

$$\sigma e \leq 0.2 \times \sigma b \qquad \text{equation (1)}$$

$$Ui \geq 02.0 \times \times 10^{-6} \times \sigma ei \qquad \text{equation (2)}$$

$$Ud \geq 4.69 \times 10^{-6} \times \sigma ed \qquad \text{equation (3)}$$

Here, $$\sigma e = (1/\log(kd_1)) \times Ee_1 \times (\alpha m - \alpha e_1) \times \Delta T_1;$$

$$\sigma ei = Ee_2 \times (\alpha e_2 - \alpha m) \times \Delta T_2;$$

$$\sigma ed = \log(kd_2) \times Ee_2 \times (\alpha e_2 - \alpha m) \times \Delta T_2;$$

σb: flexural strength of the encapsulating material at 25° C. (MPa);

Ui: shear strain energy (N·m) of the encapsulating material against the inner lead portion at the peak temperature during the solder mounting;

Ud: shear strain energy (N·m) of the encapsulating material against the die bond pad portion at the peak temperature during the solder mounting;

$kd_1$: a ratio of the flexural elastic modulus $Ed_1$ (MPa) of the die bonding material at 25° C. to an elastic modulus of 1 MPa ($Ed_1 > 1$ MPa);

$kd_2$: a ratio of the flexural elastic modulus $Ed_2$ (MPa) of the die bonding material at the peak temperature during the solder mounting to an elastic modulus of 1 MPa ($Ed_2 > 1$ MPa);

$Ee_1$: a flexural elastic modulus (MPa) of the encapsulating material at 25° C.;

$Ee_2$: a flexural elastic modulus (MPa) of the encapsulating material at the peak temperature during the solder mounting;

$\alpha e_1$: an average coefficient of thermal expansion (1/° C.) of the encapsulating material from the formation temperature of the semiconductor device (175° C.) to 25° C.;

$\alpha e_2$: an average coefficient of thermal expansion (1/° C.) of the encapsulating material from the formation temperature of the semiconductor device to the peak temperature during the solder mounting;

αm: a coefficient of thermal expansion (1/° C.) of the lead frame;

$\Delta T_1$: a temperature difference (° C.) between the formation temperature of the semiconductor device and temperature on the low temperature side of the heat cycle; and $\Delta T_2$: a temperature difference (° C.) between the formation temperature of the semiconductor device and the peak temperature during the solder mounting.

In other words, with the combination of the die bonding material containing the inorganic filler of 20–85 wt %, the resin component, and the stress-reducing agent constituting 40–70 wt % of the total amount of the resin component and the encapsulating material containing epoxy resin expressed by the general formula (I) and the inorganic filler, the content of the inorganic filler being set to 82–90 wt % of the total amount, a semiconductor device excellent in the suppression of the warpage of the semiconductor chip, heat cycle resistance, and solder mountability can be realized.

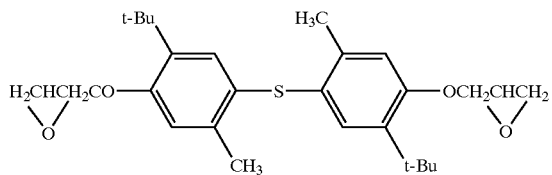

(I)

However, even in the case of satisfying at least two equations of the above described equations (1), (2), and (3), generation of the crack and the separation of the encapsulating material can be prevented. Moreover, the warpage of the chip at 25° C. after mounting the chip onto the die bond pad can be effectively prevented by setting the flexural elastic modulus of the die bonding material at 25° C. in the range of 1–300 MPa.

As described above, according to the resin-sealed semiconductor device of the present invention, the warpage of the semiconductor chip can be suppressed, and the crack in the edge of the die bond pad is not caused under the severe conditions of the heat cycle. Furthermore, when solder mounting onto the printed circuit board or the like, the separation is not caused in the inner lead portion and the die bond pad portion, thus resulting in excellent operational reliability. Particularly, the resin-sealed semiconductor device of the present invention is optimally applied to a surface-mount type package such as QFP because of the small warpage of the chip and the excellent heat cycle resistance and mountability.

In the case of using the die bonding material and the encapsulating material of the present invention, the reliability result can be predicted from the properties of the encapsulating material and the die bonding material without carrying out the series of steps of preparing the die bonding material, the encapsulating material, and the lead frame, assembling the resin-sealed semiconductor device, and evaluating the warpage of the semiconductor chip, the mountability, and the heat cycle resistance from the beginning. Consequently, the development cycle of the die bonding material and the encapsulating material for the semiconductor device can be considerably shortened.

What is claimed is:

1. A resin-sealed semiconductor device, comprising:
   at least one semiconductor chip mounted on a die bond pad of a lead frame with a die bonding material interposed therebetween and sealed by a encapsulating material, wherein
   the die bonding material at 25° C. after curing has a flexural elastic modulus $Ed_1$ of 1 MPa or more but not exceeding 300 MPa, and
   the properties of the encapsulating material and the die bonding material after curing satisfy an equation (1), $$\sigma e \leq 0.2 \times \sigma b \qquad \text{equation (1)},$$

where
   σb: a flexural strength (MPa) of the encapsulating material at 25° C.;

$$\sigma e = (1/\log(kd_1)) \times Ee_1 \times (\alpha m - \alpha e_1) \times \Delta T_1;$$

$kd_1$: a ratio of the flexural elastic modulus $Ed_1$ (MPa) of the die bonding material at 25° C. to an elastic modulus of 1 MPa ($Ed_1 > 1$ MPa);
   $Ee_1$: a flexural elastic modulus (MPa) of the encapsulating material at 25° C.;
   $\alpha e_1$: an average coefficient of thermal expansion (1/° C.) of the encapsulating material from a formation temperature of the semiconductor device to 25° C.;
   αm: a coefficient of thermal expansion (1/° C.) of the lead frame; and
   $\Delta T_1$: a temperature difference (° C.) between the formation temperature of the semiconductor device and a temperature on the low temperature side of the heat cycle.

2. The resin-sealed semiconductor device according to claim 1, wherein the die bonding material contains an inorganic filler of 20–85 wt %, a resin component, and a stress-reducing agent constituting 40–70 wt % of a total amount of the resin component.

3. The resin-sealed semiconductor device according to claim 1, wherein the properties of the encapsulating material satisfy that:

(a) the flexural elastic modulus at 25° C. is 26 GPa or less,
(b) the average coefficient of thermal expansion from the formation temperature of the semiconductor device to 25° C. is $0.7 \times 10^{-5}/°$ C. or more, and
(c) the flexural strength at 25° C. is 120 MPa or more.

4. The resin-sealed semiconductor device according to claim 1, wherein the lead frame is made of a copper alloy, and part of a surface thereof includes a plating layer made of one selected from silver, gold, or palladium.

5. A die bonding material used in a resin-sealed semiconductor device having a semiconductor chip sealed by a encapsulating material for mounting the semiconductor chip on a die bond pad of a lead frame, wherein
the die bonding material at 25° C. after curing has a flexural elastic modulus $Ed_1$ of 1 MPa or more but not exceeding 300 MPa, and
a property relation between the encapsulating material and the die bonding material after curing satisfies an equation (1), $$\sigma e \leq 0.2 \times \sigma b \qquad \text{equation (1),}$$

where
$\sigma b$: a flexural strength (MPa) of the encapsulating material at 25° C.;

$$\sigma e = (1/\log(kd_1)) \times Ee_1 \times (\alpha m - \alpha e_1) \times \Delta T_1;$$

$kd_1$: a ratio of the flexural elastic modulus $Ed_1$ (MPa) of the die bonding material at 25° C. to an elastic modulus of 1 MPa ($Ed_1 > 1$ MPa);
$Ee_1$: a flexural elastic modulus (MPa) of the encapsulating material at 25° C.;
$\alpha e_1$: an average coefficient of thermal expansion (1/° C.) of the encapsulating material from a formation temperature of the semiconductor device to 25° C.;
$\alpha m$: a coefficient of thermal expansion (1/° C.) of the lead frame; and
$\Delta T_1$: a temperature difference (° C.) between the formation temperature of the semiconductor device and a temperature on the low temperature side of the heat cycle.

6. The die bonding material according to claim 5, wherein the die bonding material contains an inorganic filler of 20–85 wt %, a resin component, and a stress-reducing agent constituting 40–70 wt % of a total amount of the resin component, and the flexural elastic modulus at 25° C. is 1 MPa or more but not exceeding 300 MPa.

7. An encapsulating material for encapsulating a semiconductor chip mounted on a die bond pad of a lead frame by a die bonding material to manufacture a semiconductor device, wherein
a property relation between the encapsulating material and the die bonding material after curing satisfies an equation (1), $$\sigma e \leq 0.2 \times \sigma b \qquad \text{equation (1),}$$

where
$\sigma b$: a flexural strength (MPa) of the encapsulating material at 25° C.;

$$\sigma e = (1/\log(kd_1)) \times Ee_1 \times (\alpha m - \alpha e_1) \times \Delta T_1;$$

$kd_1$: a ratio of the flexural elastic modulus $Ed_1$ (MPa) of the die bonding material at 25° C. to an elastic modulus of 1 MPa ($Ed_1 > 1$ MPa);
$Ee_1$: a flexural elastic modulus (MPa) of the encapsulating material at 25° C.;
$\alpha e_1$: an average coefficient of thermal expansion (1/° C.) of the encapsulating material from a formation temperature of the semiconductor device to 25° C.;
$\alpha m$: a coefficient of thermal expansion (1/° C.) of the lead frame; and
$\Delta T_1$: a temperature difference (° C.) between the formation temperature of the semiconductor device and a temperature on the low temperature side of the heat cycle.

8. The encapsulating material according to claim 7, wherein the properties after curing satisfy the following:
(a) the flexural elastic modulus at 25° C. is 26 GPa or less,
(b) the average coefficient of thermal expansion from the formation temperature of the semiconductor device to 25° C. is $0.7 \times 10^{-5}/°$ C. or more, and
(c) the flexural strength at 25° C. is 120 MPa or more.

9. A resin-sealed semiconductor device, comprising:
a lead frame including a die bond pad and an inner lead,
a semiconductor chip placed on the die bond pad with a die bonding material interposed therebetween, and
a encapsulating material encapsulating the semiconductor chip and the lead frame, wherein
when a shear strain energy of the encapsulating material against the inner lead at a peak temperature during solder mounting is Ui; and a shear strain energy of the encapsulating material against the die bond pad at the peak temperature during the solder mounting is Ud, properties of the die bonding material and the encapsulating material after curing satisfy at least one of the following equations (2) and (3), $$Ui \geq 2.0 \times 10^{-6} \times \sigma ei \qquad \text{equation (2),}$$

$$Ud \geq 4.69 \times 10^{-6} \times \sigma ed \qquad \text{equation (3),}$$

where $$\sigma ei = Ee_2 \times (\alpha e_2 \times \alpha m) \times \Delta T_2;$$

$$\sigma ed = \log(kd_2) \times Ee_2 \times (\alpha e_2 - \alpha m) \times \Delta T_2;$$

$kd_2$: a ratio of the flexural elastic modulus $Ed_2$ (MPa) of the die bonding material at a peak temperature during solder mounting to an elastic modulus of 1 MPa ($Ed_2 > 1$ MPa);
$Ee_2$: a flexural elastic modulus (MPa) of the encapsulating material at the peak temperature during the solder mounting;
$\alpha e_2$: an average coefficient of thermal expansion (1/° C.) of the encapsulating material from a formation temperature of the semiconductor device to the peak temperature during the solder mounting;
$\alpha m$: a coefficient of thermal expansion (1/° C.) of the lead frame; and
$\Delta T_2$: a temperature difference (° C.) between the formation temperature of the semiconductor device and the peak temperature during the solder mounting.

10. The resin-sealed semiconductor device according to claim 9, wherein the die bonding material contains an inorganic filler of 20–85 wt %, a resin component, and a stress-reducing agent constituting 40–70 wt % of a total amount of the resin component, and properties of the die bonding material after curing satisfy the following:

(1) the flexural elastic modulus at the peak temperature during the solder mounting is 70 MPa or less.

11. The resin-sealed semiconductor device according to claim 9, wherein the encapsulating material contains epoxy resin expressed by the following general formula (I), t-Bu of the general formula (I) representing a tertiary butyl group, and an inorganic filler, the content of the inorganic filler is 82–90 wt % of the total amount, and properties of the encapsulating material after curing satisfy the followings:
(1) the flexural elastic modulus at the peak temperature during the solder mounting is 650 MPa or less,
(2) the average coefficient of thermal expansion from the formation temperature of the semiconductor device to the peak temperature during the solder mounting is $5.0 \times 10^{-5}/°$ C. or less,
(3) the shear strain energy of the encapsulating material against the inner lead at a peak temperature during solder mounting is $1.35 \times 10^{-6}$ N·m or more, and
(4) the shear strain energy of the encapsulating material against the die bond pad at a peak temperature during solder mounting is $6.8 \times 10^{-6}$ N·m or more.

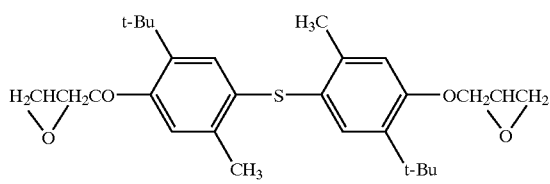

(I)

12. The resin-sealed semiconductor device according to claim 9, wherein the lead frame is made of a copper alloy, and part of a surface thereof includes a plating layer made of one selected from silver, gold, or palladium.

13. A die bonding material for mounting a semiconductor chip on a die bond pad of a lead frame used in a resin-sealed semiconductor device including the semiconductor chip sealed by a encapsulating material, the lead frame including the die bond pad and an inner lead, wherein
when a flexural elastic modulus of the die bonding material at a peak temperature during solder mounting after curing is $Ed_2$; a ratio of the flexural elastic modulus $Ed_2$ of the die bonding material at the peak temperature during the solder mounting to an elastic modulus of 1 MPa ($Ed_2>1$ MPa) is $kd_2$; a shear strain energy of the encapsulating material against the inner lead at the peak temperature during the solder mounting is Ui; and a shear strain energy of the encapsulating material against the die bond pad at the peak temperature during the solder mounting is Ud, a property relation between the die bonding material and the encapsulating material after curing satisfy at least one of the following equations (2) and (3), $$Ui \geq 2.0 \times 10^{-6} \times \sigma ei \qquad \text{equation (2),}$$

$$Ud \geq 4.69 \times 10^{-6} \times \sigma ed \qquad \text{equation (3),}$$

where $$\sigma ei = Ee_2 \times (\alpha e_2 - \alpha m) \times \Delta T_2;$$

$$\sigma ed = \log(kd_2) \times Ee_2 \times (\alpha e_2 - \alpha m) \times \Delta T_2;$$

$Ee_2$: a flexural elastic modulus (MPa) of the encapsulating material at the peak temperature during the solder mounting;

$\alpha e_2$: an average coefficient of thermal expansion (1/° C.) of the encapsulating material from a formation temperature of the semiconductor device to the peak temperature during the solder mounting;

$\alpha m$: a coefficient of thermal expansion (1/° C.) of the lead frame; and $\Delta T_2$: a temperature difference (° C.) between the formation temperature of the semiconductor device and the peak temperature during the solder mounting.

14. The die bonding material according to claim 13, wherein the die bonding material contains an inorganic filler of 20–85 wt %, a resin component, and a stress-reducing agent constituting 40–70 wt % of the total amount of the resin component, and the flexural elastic modulus $Ed_2$ at the peak temperature during the solder mounting is 70 MPa or less.

15. A encapsulating material for encapsulating a semiconductor chip mounted on a die bond pad of a lead frame by a die bonding material to manufacture a semiconductor device, the lead frame including the die bond pad and an inner lead, wherein
when a shear strain energy of the encapsulating material against the inner lead at a peak temperature during solder mounting is Ui; and a shear strain energy of the encapsulating material against the die bond pad at the peak temperature during the solder mounting is Ud, a property relation between the encapsulating material and the die bonding material after curing satisfy at least one of the following equations (2) and (3), $$Ui \geq 2.0 \times 10^{-6} \times \sigma ei \qquad \text{equation (2),}$$

$$Ud \geq 4.69 \times 10^{-6} \times \sigma ed \qquad \text{equation (3),}$$

where $$\sigma ei = Ee_2 \times (\alpha e_2 - \alpha m) \times \Delta T_2;$$

$$\sigma ed = \log(kd_2) \times Ee_2 \times (\alpha e_2 - \alpha m) \times \Delta T_2;$$

$kd_2$: a ratio of the flexural elastic modulus $Ed_2$ (MPa) of the die bonding material at the peak temperature during the solder mounting to an elastic modulus of 1 MPa ($Ed_2>1$ MPa);

$Ee_2$: a flexural elastic modulus (MPa) of the encapsulating material at the peak temperature during the solder mounting;

$\alpha e_2$: an average coefficient of thermal expansion (1/° C.) of the encapsulating material from a formation temperature of the semiconductor device to the peak temperature during the solder mounting;

$\alpha m$: a coefficient of thermal expansion (1/° C.) of the lead frame; and $\Delta T_2$: a temperature difference (° C.) between the formation temperature of the semiconductor device and the peak temperature during the solder mounting.

16. The encapsulating material according to claim 15, wherein the encapsulating material contains epoxy resin expressed by the following general formula (I), t-Bu of the general formula (I) representing a tertiary butyl group, and an inorganic filler, the content of the inorganic filler is 82–90 wt % of the total amount, and properties after curing satisfy the following:
(1) the flexural elastic modulus at the peak temperature during the solder mounting is 650 MPa or less,
(2) the average coefficient of thermal expansion from the formation temperature of the semiconductor device to the peak temperature during the solder mounting is $5.0\times10^{-5}/°$ C. or less, (3) the shear strain energy of the encapsulating material against the inner lead at a peak temperature during solder mounting is $1.35\times10^{-6}$ N·m or more, and (4) the shear strain energy of the encapsulating material against the die bond pad at a peak temperature during solder mounting is $6.8\times10^{-6}$ N·m or more.

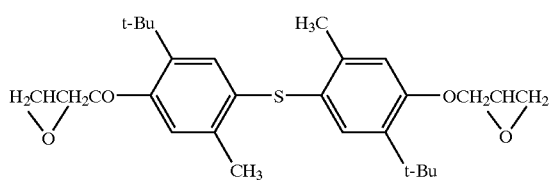

(I)

17. A resin-sealed semiconductor device, comprising:

a lead frame including a die bond pad and an inner lead, a semiconductor chip placed on the die bond pad with a die bonding material interposed therebetween; and a encapsulating material encapsulating the semiconductor chip and the lead frame, wherein when a flexural strength of the encapsulating material at 25° C. is σb (MPa); a shear strain energy of the encapsulating material against the inner lead at a peak temperature during solder mounting is Ui (N·m); and a shear strain energy of the encapsulating material against the die bond pad at the peak temperature during the solder mounting is Ud(N·m), properties of the die bonding material and the encapsulating material after curing satisfy at least one of the following equations (1), (2) and (3), $\sigma e \leq 0.2 \times \sigma b$  equation (1), $Ui \geq 2.0\times10^{-6} \times \sigma ei$  equation (2), $Ud \geq 4.69\times10^{-6} \times \sigma ed$  equation (3), where $\sigma e=(1/\log(kd_1))\times Ee_1\times(\alpha m-\alpha e_1)\times\Delta T_1$  equation (4);

$\sigma ei=Ee_2\times(\alpha e_2-\alpha m)\times\Delta T_2$  equation (5);

$\sigma ed=\log(kd_2)\times Ee_2\times(\alpha e_2\times\alpha m)\times\Delta T_2$  equation (6);

$kd_1$: a ratio of the flexural elastic modulus $Ed_1$ (MPa) of the die bonding material at 25° C. to an elastic modulus of 1 MPa ($Ed_1>1$ MPa);

$kd_2$: a ratio of the flexural elastic modulus $Ed_2$ (MPa) of the die bonding material at the peak temperature during the solder mounting to an elastic modulus of 1 MPa ($Ed_2>1$ MPa);

$Ee_1$: a flexural elastic modulus (MPa) of the encapsulating material at 25° C.;

$Ee_2$: a flexural elastic modulus (MPa) of the encapsulating material at the peak temperature during the solder mounting;

$\alpha e_1$: an average coefficient of thermal expansion (1/° C.) of the encapsulating material from a formation temperature of the semiconductor device to a room temperature (25° C.);

$\alpha e_2$: an average coefficient of thermal expansion (1/° C.) of the encapsulating material from the formation temperature of the semiconductor device to the peak temperature during the solder mounting;

$\alpha m$: a coefficient of thermal expansion (1/° C.) of the lead frame;

$\Delta T_1$: a temperature difference (° C.) between the formation temperature of the semiconductor device and a temperature on the low temperature side of the heat cycle; and $\Delta T_2$: a temperature difference (° C.) between the formation temperature of the semiconductor device and the peak temperature during the solder mounting.

18. The resin-sealed semiconductor device according to claim 17, wherein the die bonding material contains an inorganic filler of 20–85 wt %, a resin component, and a stress reducing agent constituting 40–70 wt % of the total amount of the resin component, and properties of the die bonding material after curing satisfy the following:

(1) the flexural elastic modulus at 25° C. is 1 MPa or more but not exceeding 300 MPa, and (2) the flexural elastic modulus at the peak temperature during the solder mounting is 70 MPa or less.

19. The resin-sealed semiconductor device according to claim 17, wherein the encapsulating material contains epoxy resin expressed by the following general formula (I), t-Bu of the general formula (I) representing a tertiary butyl group, and an inorganic filler, the content of the inorganic filler is 82–90 wt % of the total amount, and properties of the encapsulating material after curing satisfy the followings:

(1) the flexural elastic modulus at 25° C. is 26 GPa or less, (2) the average coefficient of thermal expansion from the formation temperature of the semiconductor device to 25° C. is $0.7\times10^{-5}/°$ C. or more, (3) the flexural strength at 25° C. is 120 MPa or more, (4) the flexural elastic modulus at the peak temperature during the solder mounting is 650 MPa or less, (5) the average coefficient of thermal expansion from the formation temperature of the semiconductor device to the peak temperature during the solder mounting is $5.0\times10^{-5}/°$ C. or less, (6) the shear strain energy of the encapsulating material against the inner lead at the peak temperature during the solder mounting is $1.35\times10^{-6}$ N·m or more, and (7) the shear strain energy of the encapsulating material against the die bond pad at the peak temperature during the solder mounting is $6.8\times10^{-6}$ N·m or more.

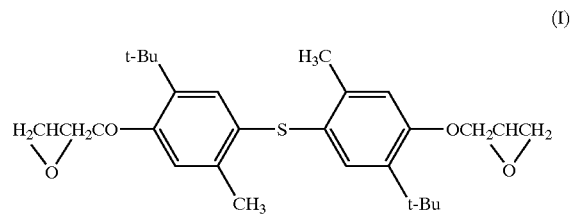

(I)

20. The resin-sealed semiconductor device according to claim 17, wherein the lead frame is made of a copper alloy, and part of a surface thereof includes a plating layer made of one selected from silver, gold, or palladium.

21. A die bonding material for mounting a semiconductor chip on a die bond pad of a lead frame used in a resin-sealed semiconductor device including the semiconductor chip sealed by an encapsulating material, the lead frame including the die bond pad and an inner lead, wherein
when a flexural elastic modulus of the die bonding material at 25° C. is $Ed_1$ (MPa); a flexural elastic modulus of the die bonding material at a peak temperature during solder mounting is $Ed_2$ (MPa); a ratio of the flexural elastic modulus $Ed_1$ (MPa) of the die bonding material at 25° C. to an elastic modulus of 1 MPa ($Ed_1$>1 MPa) is $kd_1$; a ratio of the flexural elastic modulus $Ed_2$ of the die bonding material at the peak temperature during the solder mounting to an elastic modulus of 1 MPa ($Ed_2$>1 MPa) is $kd_2$; a flexural strength of the encapsulating material at 25° C. is σub (MPa); a shear strain energy of the encapsulating material against the inner lead at the peak temperature during the solder mounting is Ui (N·m); and a shear strain energy of the encapsulating material against the die bond pad at the peak temperature during the solder mounting is Ud (N·m), properties of the die bonding material and the encapsulating material after curing satisfy at least one of the following equations (1), (2) and (3), $$σe ≤ 0.2 × σb \quad \text{equation (1)},$$

$$Ui ≥ 2.0 × 10^{-6} × σei \quad \text{equation (2)},$$

$$Ud ≥ 4.69 × 10^{-6} × σed \quad \text{equation (3)},$$

where $$σe = (1/\log(kd_1)) × Ee_1 × (αm - αe_1) × ΔT_1 \quad \text{equation (4)};$$

$$σei = Ee_2 × (αe_2 - αm) × ΔT_2 \quad \text{equation (5)};$$

$$σed = \log(kd_2) × Ee_2 × (αe_2 - αm) × ΔT_2 \quad \text{equation (6)};$$

$Ee_1$: a flexural elastic modulus (MPa) of the encapsulating material at 25° C.;
$Ee_2$: a flexural elastic modulus (MPa) of the encapsulating material at the peak temperature during the solder mounting;
$αe_1$: an average coefficient of thermal expansion (1/° C.) of the encapsulating material from a formation temperature of the semiconductor device to a room temperature (25° C.);
$αe_2$: an average coefficient of thermal expansion (1/° C.) of the encapsulating material from the formation temperature of the semiconductor device to the peak temperature during the solder mounting;
αm: a coefficient of thermal expansion (1/° C.) of the lead frame;
$ΔT_1$: a temperature difference (° C.) between the formation temperature of the semiconductor device and a temperature on the low temperature side of the heat cycle; and
$ΔT_2$: a temperature difference (° C.) between the formation temperature of the semiconductor device and the peak temperature during the solder mounting.

22. The die bonding material according to claim 21, wherein the die bonding material contains an inorganic filler of 20–85 wt %, a resin component, and a stress reducing agent constituting 40–70 wt % of the total amount of the resin component, and properties after curing satisfy the following:
(1) the flexural elastic modulus at 25° C. is 1 MPa or more but not exceeding 300 MPa, and
(2) the flexural elastic modulus at the peak temperature during the solder mounting is 70 MPa or less.

23. A encapsulating material for encapsulating a semiconductor chip with an encapsulating material to manufacture a semiconductor device, the semiconductor chip being mounted on a die bond pad of a lead frame by a die bonding material, the lead frame including the die bond pad and an inner lead, wherein
when a flexural strength of the encapsulating material at 25° C. is σb (MPa); a flexural elastic modulus of the encapsulating material at 25° C. is $Ee_1$ (MPa); a flexural elastic modulus of the encapsulating material at a peak temperature during solder mounting is $Ee_2$ (MPa); a shear strain energy of the encapsulating material against the inner lead at the peak temperature during the solder mounting is Ui (N·m); and a shear strain energy of the encapsulating material against the die bond pad at the peak temperature during the solder mounting is Ud (N·m), a property relation between the die bonding material and the encapsulating material after curing satisfy at least one of the following equations (1), (2) and (3), $$σe ≤ 0.2σb \quad \text{equation (1)},$$

$$Ui ≥ 2.0 × 10^{-6} × σei \quad \text{equation (2)},$$

$$Ud ≥ 4.69 × 10^{-6} × σed \quad \text{equation (3)},$$

where $$σe = (1/\log(kd_1)) × Ee_1 × (αm - αe_1) × ΔT_1 \quad \text{equation (4)};$$

$$σei = Ee_2 × (αe_2 - αm) × ΔT_2 \quad \text{equation (5)};$$

$$σed = \log(kd_2) × Ee_2 × (αe_2 - αm) × ΔT_2 \quad \text{equation (6)};$$

$kd_1$: a ratio of the flexural elastic modulus $Ed_1$ (MPa) of the die bonding material at 25° C. to an elastic modulus of 1 MPa ($Ed_1$>1 MPa);
$kd_2$: a ratio of the flexural elastic modulus $Ed_2$ (MPa) of the die bonding material at the peak temperature during the solder mounting to an elastic modulus of 1 MPa ($Ed_2$>1 MPa);
$αe_1$: an average coefficient of thermal expansion (1/° C.) of the encapsulating material from the formation temperature of the semiconductor device to a room temperature (25° C.);
$αe_2$: an average coefficient of thermal expansion (1/° C.) of the encapsulating material from the formation temperature of the semiconductor device to the peak temperature during the solder mounting;
αm: a coefficient of thermal expansion (1/° C.) of the lead frame;
$ΔT_1$: a temperature difference (° C.) between the formation temperature of the semiconductor device and a temperature on the low temperature side of the heat cycle; and $\Delta T_2$: a temperature difference (° C.) between the formation temperature of the semiconductor device and the peak temperature during the solder mounting.

24. The encapsulating material according to claim 23, wherein the encapsulating material contains epoxy resin expressed by the following general formula (I), t-Bu of the general formula (I) representing a tertiary butyl group, and an inorganic filler, the content of the inorganic filler is 82–90 wt % of the total amount, and properties after curing satisfy the followings:

(1) the flexural elastic modulus at 25° C. is 26 GPa or less,
(2) the average coefficient of thermal expansion from a formation temperature of the semiconductor device to 25° C. is $0.7 \times 10^{-5}/°$ C. or more,
(3) the flexural strength at 25° C. is 120 MPa or more,
(4) the flexural elastic modulus at the peak temperature during the solder mounting is 650 MPa or less,
(5) the average coefficient of thermal expansion from the formation temperature of the semiconductor device to the peak temperature during the solder mounting is $5.0 \times 10^{-5}/°$ C. or less,
(6) the shear strain energy of the encapsulating material against the inner lead at a peak temperature during solder mounting is $1.35 \times 10^{-6}$ N·m or more, and
(7) the shear strain energy of the encapsulating material against the die bond pad at a peak temperature during solder mounting is $6.8 \times 10^{-6}$ N·m or more.

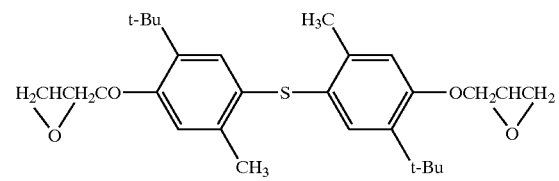

(I)

* * * * *